US006759146B2

(12) United States Patent
Aziz et al.

(10) Patent No.: US 6,759,146 B2
(45) Date of Patent: *Jul. 6, 2004

(54) ORGANIC DEVICES

(75) Inventors: Hany Aziz, Burlington (CA); Nan-Xing Hu, Oakville (CA); Ah-Mee Hor, Mississauga (CA); Zoran D. Popovic, Mississauga (CA)

(73) Assignee: Xerox Corporation, Stamford, CT (US)

( * ) Notice: Subject to any disclaimer, the term of this patent is extended or adjusted under 35 U.S.C. 154(b) by 194 days.

This patent is subject to a terminal disclaimer.

(21) Appl. No.: 10/005,930

(22) Filed: Nov. 8, 2001

(65) Prior Publication Data

US 2003/0134146 A1 Jul. 17, 2003

(51) Int. Cl.[7] .............................................. H05B 33/12

(52) U.S. Cl. ...................... 428/690; 428/917; 313/504; 313/506; 427/66

(58) Field of Search ................................. 428/690, 917, 428/213, 332; 313/504, 506; 427/66

(56) References Cited

U.S. PATENT DOCUMENTS

| | | | |
|---|---|---|---|
| 4,356,429 A | 10/1982 | Tang | 313/503 |
| 4,539,507 A | 9/1985 | VanSlyke et al. | 313/504 |
| 4,720,432 A | 1/1988 | VanSlyke et al. | 428/457 |
| 4,769,292 A | 9/1988 | Tang et al. | 428/690 |
| 5,061,569 A | 10/1991 | VanSlyke et al. | 428/457 |
| 5,141,671 A | 8/1992 | Bryan et al. | 252/301.16 |
| 5,150,006 A | 9/1992 | VanSlyke et al. | 313/504 |
| 5,151,629 A | 9/1992 | VanSlyke et al. | 313/504 |
| 5,227,252 A | 7/1993 | Murayama et al. | 428/690 |
| 5,458,977 A | * 10/1995 | Hosokawa et al. | 428/411.1 |
| 5,516,577 A | 5/1996 | Matsuura et al. | 428/212 |
| 5,601,903 A | 2/1997 | Fujii et al. | 428/212 |
| 5,739,635 A | 4/1998 | Wakimoto | 313/504 |
| 5,792,557 A | * 8/1998 | Nakaya et al. | 428/411.1 |
| 5,846,666 A | 12/1998 | Hu et al. | 428/690 |
| 5,853,905 A | 12/1998 | So et al. | 428/690 |
| 5,925,472 A | 7/1999 | Hu et al. | 428/690 |
| 5,925,980 A | 7/1999 | So et al. | 313/504 |
| 5,935,720 A | 8/1999 | Chen et al. | 428/690 |
| 5,942,340 A | 8/1999 | Hu et al. | 428/690 |
| 5,952,115 A | 9/1999 | Hu et al. | 428/690 |
| 6,020,078 A | 2/2000 | Chen et al. | 428/690 |
| 6,048,630 A | 4/2000 | Burrows et al. | 428/690 |
| 6,057,048 A | 5/2000 | Hu et al. | 428/690 |
| 6,114,055 A | 9/2000 | Choong et al. | 428/690 |
| 6,130,001 A | 10/2000 | Shi et al. | 428/690 |
| 6,229,012 B1 | 5/2001 | Hu et al. | 544/180 |
| 6,392,250 B1 | * 5/2002 | Aziz et al. | 257/40 |
| 6,392,339 B1 | * 5/2002 | Aziz et al. | 313/504 |
| 2001/0053462 A1 | * 12/2001 | Mishima | 428/690 |
| 2002/0034659 A1 | * 3/2002 | Nishi et al. | 428/690 |

OTHER PUBLICATIONS

Copending application Ser. No. 09/357,551, filed Jul. 20, 1999, on "Organic Light Emitting Devices Having Improved Efficiency and Operation Lifetime" by Hany Aziz et al.
Copending application Ser. No. 09/606,670, filed Jun. 30, 2000, on "Organic Light Emitting Devices Having Improved Performance" by Hany Aziz et al.
Copending application Ser. No. 09/800,716 on "Cathodes For Electroluminescent Devices Having Improved Contrast and Reduced Dark Spot Growth" by Yoon–Fei Liew et al.
Copending application Ser. No. 09/770,159, filed Jan. 26, 2001, on "Organic Light Emitting Devices" by Hany Aziz et al.
Copending application Ser. No. 09/770,154, filed Jan. 26, 2001, on "Electroluminescent Devices" by Hany Aziz et al.
Copending application Ser. No. 09/935,031, filed Aug. 22, 2001, on "OLEDS Having Light Absorbing Electrode" by Hany Aziz et al.
S.A. Van Slyke et al., "Organic Electroluminescent Devices with Improved Stability", Appl. Phys. Lett. 69, pp. 2160–2162, 1996.
Kido et al., "Organic Electroluminescent Devices Based on Molecularly Doped Polymers", Appl. Phys. Lett. 61, pp. 761–763, 1992.
S. Naka et al., "Organic Electroluminescent Devices Using a Mixed Single Layer," Jpn. J. Appl. Phys. 33, pp. L1772–L1774, 1994.
W. Wen et al., Appl. Phys. Lett. 71, 1302 (1997).
C. Wu et al., "Efficient Organic Electroluminescent Devices Using Single–Layer Doped Polymer Thin Films with Bipolar Carrier Transport Abilities", IEEE Transactions on Electron Devices 44, pp. 1269–1281, 1997.
H. Aziz et al., Science 283, 1900 (1999).
Z.D. Popovic et al., Proceedings of the SPIE, vol. 3176, "Organic Light–Emitting Materials and Devices II", San Diego, CA, Jul. 21–23, 1998, pp. 68 to 73.
Y. Hamada et al., "Influence of the Emission Site on the Running Durability of Organic Electroluminescent Devices", Jpn. J. Appl. Phys. 34, pp. L824–L826, 1995.
Zhou et al., "Real–Time Observation of Temperature Rise and Thermal Breakdown Processes in Organic Leds Using an IR Imaging And Analysis System", Advanced Materials 12, pp 265–269, 2000.
J.R. Sheats et al., "Organic Electroluminescent Devices", Science 273, pp. 884–888, 1996.
S. Tokito et al., "High–Temperature Operation of an Electroluminescent Device Fabricated Using a Novel Triphenylamine Derivative", Appl. Phys. Lett. 69, 878 (1996).

(List continued on next page.)

Primary Examiner—Cynthia Kelly
Assistant Examiner—Dawn Garrett
(74) Attorney, Agent, or Firm—E. O. Palazzo

(57) ABSTRACT

An electroluminescent device containing a number of layers with a mixed region of a hole transport compound, and an electron transport compound, and hole and electron transport regions.

55 Claims, 2 Drawing Sheets

OTHER PUBLICATIONS

Kido et al., "White light emitting organic electroluminescent device using lanthanide complexes", *Jpn. J. App. Phys.*, vol. 35, pp. L394–L396 (1996).

Baldo et al., "Highly efficient organic phosphorescent emission from organic electroluminescent devices", *Letters to Nature*, vol. 395, pp 151–154 (1998).

* cited by examiner

ORGANIC DEVICES

COPENDING APPLICATIONS

Illustrated in copending application U.S. Ser. No. 10/005,404, filed concurrently herewith, the disclosure of which is totally incorporated herein by reference, is an organic light emitting device comprising (i) a first electrode;

(ii) a region comprising a mixture of (1) a tertiary aromatic amine, (2) a metal oxinoid, and (3) a red emitting material represented by

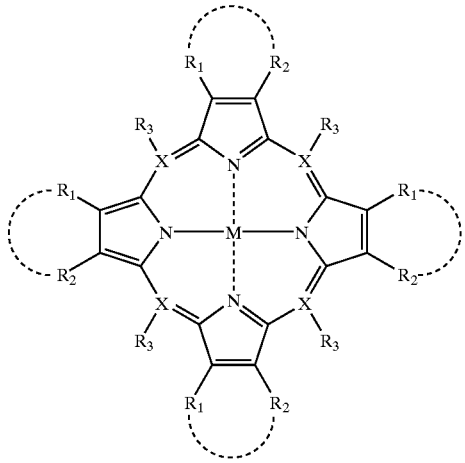

wherein X is a carbon C atom or a nitrogen N atom, or optionally oxygen or sulfur; $R_1$, $R_2$ and $R_3$ are each independently selected from the group consisting of hydrogen, alkyl, substituted alkyl, aryl, and substituted aryl; M is a divalent, trivalent or tetravalent metal;

(iii) a second electrode;

(iv) an optional protective element coated on at least one of the first and second electrodes; wherein one of said first and second electrodes is a hole injection anode, and one of said electrodes is an electron injection cathode; and at least one of (v) a hole transport region situated between the anode and the region (ii), and wherein the hole transport region optionally includes a buffer layer; and (vi) an electron transport region situated between the cathode and the region (ii), and wherein said red emitting component is present in an amount of from 1 to about 40 weight percent based on total weights of components in region (ii).

Illustrated in copending application U.S. Ser. No. 10/005,518, filed concurrently herewith, the disclosure of which is totally incorporated herein by reference, is an organic light emitting device comprising (i) a first electrode;

(ii) a mixed region comprising a mixture of (1) a tertiary aromatic amine, (2) a metal oxinoid, and (3) a green emitting coumarin dye of the Formula

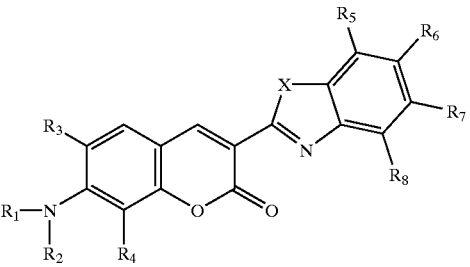

wherein X is selected from the group consisting of an oxygen atom, a sulfur atom, an alkyl imino group and aryl imino group; $R_1$ and $R_2$ are individually selected from the group consisting of alkyl, aryl, and carbocyclic; $R_3$ and $R_4$ are individually selected from the group consisting of a hydrogen atom, alkyl, and optionally a branched or unbranched 5 or 6 member substituent ring connecting with $R_1$ and $R_2$, respectively; and $R_5$, $R_6$, $R_7$, and $R_8$ are individually selected from the group consisting of a hydrogen atom, an alkoxy group and an alkyl group;

(iii) a second electrode;

(iv) an optional thermal protective element coated on one of the first and second electrodes; wherein one of the first and second electrodes is a hole injecting anode, and one of the first and second electrodes is an electron injecting cathode, and wherein the organic light emitting device further comprises at least one of (v) a hole transport region interposed or situated between the anode and the mixed region, wherein the hole transport region optionally includes a buffer layer; and (vi) an electron transport region interposed between the cathode and the mixed region, and wherein said green emitting dye is present in an amount of from about 0.01 to about 10 weight percent based on the total of said mixed layer components (ii).

Illustrated in copending application U.S. Ser. No. 10/005,970, flied concurrently herewith, the disclosure of which is totally incorporated herein by reference, is an organic light emitting device comprising (i) an anode;

(ii) a hole transport layer comprising a mixture of a porphyrin and a hole transport material;

(iii) a mixed region comprising a mixture of (1) a hole transport material, and (2) an electron transport material, and which mixed region optionally contains an organic luminescent material;

(iv) a cathode; and wherein the organic light emitting device optionally further comprises at least one of (v) an electron transport region interposed between the mixed region and the cathode; and (vi) an optional thermal protective element coated on one of the anode and cathode.

Illustrated in copending application U.S. Ser. No. 10/005,993, filed concurrently herewith, the disclosure of which is totally incorporated herein by reference, is an organic light emitting device, comprising (i) a first electrode;

(ii) a region comprising a mixture of (1) N,N'-bis(p-biphenyl)-N,N'-diphenyl benzidine, and (2) an electron transport material, and which region further optionally comprises an organic luminescent material, and wherein said mixed region is capable of emitting light in response to hole-electron recombination;

(iii) a second electrode;

(iv) an optional thermal layer coated on at least one of the first and second electrodes, wherein one of said first and second electrodes is a hole injection anode, and one of said electrodes is an electron injection cathode, and wherein the organic light emitting device further comprises at least one of (v) a hole transport region interposed or situated between the first electrode and the mixed region; and (vi) an electron transport region interposed or situated between the mixed region and the cathode.

Illustrated in copending application U.S. Ser. No. 09/935,031, filed Aug. 22, 2001 on "OLEDs Having Light Absorbing Electrode", U.S. Publication No. 20030038593, the disclosure of which is totally incorporated herein by reference is an organic light emitting device comprising a first electrode;

a second electrode; and a luminescent region including an organic electroluminescent material between the first electrode and the second electrode, wherein one of the first electrode and the second electrode includes both a substantially transparent charge injecting layer adjacent to the luminescent region and an electrically conductive light absorbing layer.

Illustrated in U.S. Pat. No. 6,392,339 on "Organic Light Emitting Devices Having Improved Efficiency and Operation Lifetime", filed on Jul. 20, 1999, the disclosure of which is totally incorporated herein by reference, is an organic light emitting device, comprising, for example, a mixed region comprising a mixture of a hole transport material and an electron transport material, one of the hole transport material and the electron transport material being an emitter, the mixed region having a first surface and a second surface;

at least one of (i) a hole transport material on the first surface, and (ii) an electron transport material on the second surface;

an anode in contact with the hole transport material on the first surface or with the first surface; and a cathode in contact with the electron transport material on the second surface or with the second surface; and U.S. Pat. No. 6,392,250 on "Organic Light Emitting Devices Having Improved performance", filed on Jun. 30, 2000, the disclosure of which is totally Incorporated herein by reference, is an organic light emitting device, comprising, for example, a mixed region having a first surface and a second surface, the mixed region comprising a mixture of a hole transport material, an electron transport material and at least one dopant, the dopant being an emitter, at least one of the hole transport material and the electron transport material optionally being an emitter;

at least one of (i) a hole transport region on the first surface, and (ii) an electron transport region on the second surface;

an anode in contact with the hole transport region on the first surface or with the first surface; and a cathode in contact with the electron transport region on the second surface or with the second surface.

Illustrated in copending applications U.S. Ser. No. 09/770,159 on "Organic light Emitting Devices", filed Jan. 26, 2001, U.S. Publication No. 20020135296, the disclosure of which is totally incorporated herein by reference, is an organic light emitting device comprising, for example, in an optional sequence (i) a substrate;

(ii) a first electrode;

(iii) a mixed region comprising a mixture of a hole transport material and an electron transport material, and wherein this mixed region includes at least one organic luminescent material;

(iv) a second electrode;

(v) a thermal protective element coated on the second electrode, wherein one of the two said first and second electrodes is a hole injection anode, and one of the two said electrodes is an electron injection cathode, and wherein the organic light emitting device further comprises;

(vi) a hole transport region, interposed between the anode and the mixed region, wherein the hole transport region optionally includes a buffer layer; and (vii) an electron transport region interposed between the second electrode and the mixed region; and in U.S. Ser. No. 09/770,154 on "Electroluminescent Devices", filed on Jan. 26, 2001, U.S. Publication No. 20020145380, the disclosure of which is totally incorporated herein by reference, is disclosed an organic light emitting device comprising in sequence a first electrode;

a light emitting region comprising an organic luminescent material; and a second electrode, and a thermal protective element.

Illustrated in copending application U.S. Ser. No. 09/800,716, now abandoned, on "Cathodes For Electroluminescent Devices Having Improved Contrast and Reduced Dark Spot Growth", filed on Mar. 8, 2001, the disclosure of which is totally incorporated herein by reference, is art electroluminescent device, comprising:

a first electrode;

a second electrode; and a luminescent region between the first electrode and the second electrode, wherein one of the first electrode and the second electrode comprises a metal-organic mixed region including:

a metal;

an organic material; and at least one component selected from the group consisting of metals, organic materials and inorganic materials.

BACKGROUND

This invention relates to optoelectronic devices and, more particularly, to organic light emitting devices (organic EL devices). More specifically, the present invention relates to substantially stable organic EL devices and devices possessing extended operational life time, such as at least about 1,000 hours in embodiments, which is prior to their luminance decreasing to some percent of its initial luminance value, such as about 50 percent of the initial luminance, and which devices do not in embodiments, for example, usually degrade in the form of experiencing a decrease in their luminance at high temperatures, such as about 100° C., and moreover, which devices are not substantially adversely affected by high temperatures, such as having a life time of at least about 100 hours at these temperatures.

The organic light emitting devices of the present invention can be utilized in various devices, such as displays that typically are operated over a broad range of temperature conditions. The operational stability at high temperature conditions provided by the organic light emitting devices of this invention enables in embodiments the use of these devices at high temperatures for extended periods of time.

REFERENCES

An organic electroluminescent (EL) device can be comprised of a layer of an organic luminescent material interposed between an anode, typically comprised of a transparent conductor, such as indium tin oxide, and a cathode, typically a low work function metal such as magnesium, calcium, aluminum, or the alloys thereof with other metals. The EL device functions on the primary principle that under an electric field, positive charges (holes) and negative charges (electrons) are respectively injected from the anode and cathode into the luminescent layer and undergo recombination to form excitonic states which subsequently emit light. A number of organic EL devices have been prepared from a laminate of an organic luminescent material and electrodes of opposite polarity, which devices include a single crystal material, such as single crystal anthracene as the luminescent substance as described, for example, in U.S. Pat. No. 3,530,325, the disclosure of which is totally incorporated herein by reference. These types of devices are believed to require excitation voltages on the order of 100 volts or greater.

An organic EL device with a multilayer structure can be formed as a dual layer structure comprising one organic layer adjacent to the anode supporting hole transport, and another organic layer adjacent to the cathode supporting electron transport and acting as the organic luminescent zone of the device. Examples of these devices are disclosed in U.S. Pat. Nos. 4,356,429; 4,539,507; 4,720,432, and 4,769,292, the disclosures of which are totally incorporated herein by reference, wherein U.S. Pat. No. 4,769,292, the disclosure of which is totally incorporated herein by reference, discloses, for example, an organic EL device comprising three separate layers, a hole transport layer, a luminescent layer, and an electron transport layer, which layers are laminated in sequence and are sandwiched between an anode and a cathode, and wherein a fluorescent dopant material is added to the emission zone or layer whereby the recombination of charges results in the excitation of the fluorescent material. In some of these multilayer structures, such as, for example, organic light emitting devices described in U.S. Pat. No. 4,720,432, the disclosure of which is totally incorporated herein by reference, the organic light emitting device further comprises a buffer layer interposed between the hole transport layer and the anode. The combination of the hole transport layer and the buffer layer forms a dual-layer hole transport region, reference S. A. Van Slyke et al., "Organic Electroluminescent Devices with Improved Stability," *Appl. Phys. Lett.* 69, pp. 2160–2162, 1996, the disclosure of which is totally incorporated herein by reference.

There have also been attempts to obtain electroluminescence from organic light emitting devices containing mixed layers, for example, layers in which both the hole transport material and the emitting electron transport material are mixed together in one single layer, see, for example, Kido et al., "Organic Electroluminescent Devices Based On Molecularly Doped Polymers," *Appl. Phys. Lett.* 61, pp. 761–763, 1992; S. Naka et al., "Organic Electroluminescent Devices Using a Mixed Single Layer," *Jpn. J. Appl. Phys.* 33, pp. L1772–L1774, 1994; W. Wen et al., *Appl. Phys. Lett.* 71, 1302 (1997); and C. Wu et al., "Efficient Organic Electroluminescent Devices Using Single-Layer Doped Polymer Thin Films with Bipolar Carrier Transport Abilities", *IEEE Transactions on Electron Devices* 44, pp. 1269–1281, 1997. In a number of these devices, the electron transport material and the emitting material can be the same or the mixed layer can further comprise an emitting material as a dopant. Other examples of organic light emitting devices which are formed of a single organic layer comprising a hole transport material and an electron transport material can be found, for example, in U.S. Pat. Nos. 5,853,905; 5,925,980; 6,114,055 and 6,130,001, the disclosures of which are totally incorporated herein by reference. As indicated in the article by S. Naka et al., these single mixed layer organic light emitting devices are generally less efficient than multilayer organic light emitting devices. These devices, which include only a single mixed layer of a hole transport material, such as NBP (N,N'-di(naphthalene-1-yl)-N,N'-diphenyl-benzidine), and an emitting electron transport material, such as $Alq_3$ (tris (8-hydroxyquinoline) aluminum), are believed to be unstable and to have poor efficiency. The instability of these devices is believed to be caused by the direct contact between the electron transport material in the mixed layer and the hole injecting contact comprised of indium tin oxide (ITO), which results in the formation of an unstable cationic electronic transport material, and the instability of the mixed layer/cathode interface, see H. Aziz et al., *Science* 283, 1900 (1999), the disclosure of which is totally incorporated herein by reference. In addition, the single mixed layer may result in high leakage currents and hence poor efficiency, see Z. D. Popovic et al., *Proceedings of the SPIE, Vol.* 3176, "Organic Light-Emitting Materials and Devices II", San Diego, Calif., Jul. 21–23, 1998, pp. 68 to 73, the disclosure of which is totally incorporated herein by reference.

While recent progress in organic EL research has elevated the potential of organic EL devices for widespread applications, the operational stability of current available devices may in some instances be below expectations. A number of known organic light emitting devices have relatively short operational lifetimes before their luminance drops to some percentage of its initial value. Providing interface layers as described, for example, in S. A. Van Slyke et al., "Organic Electroluminescent Devices with Improved Stability," *Appl. Phys. Lett.* 69, pp. 2160–2162, 1996, and doping as described, for example, in Y. Hamada et al., "Influence of the Emission Site on the Running Durability of Organic Electroluminescent Devices", *Jpn. J. Appl. Phys.* 34, pp. L824–L826, 1995, may perhaps increase the operational lifetime of organic light emitting devices for room temperature operation, however, the effectiveness of these organic light emitting devices deteriorates for high temperature device operation. In general, the device lifetime can be reduced by a factor of about two for each 10° C. increment in the operational temperature. Moreover, at high temperatures, the susceptibility of the organic light emitting devices to degrade is increased as described, for example, in Zhou et al., "Real-Time Observation of Temperature Rise and Thermal Breakdown Processes in Organic Leds Using an IR Imaging And Analysis System", *Advanced Materials* 12, pp 265–269, 2000, which further reduces the stability of the devices. As a result, the operational lifetime of these organic light emitting devices at a normal display luminance level of about 100 $cd/m^2$ is limited, for example, to about a hundred hours or less at temperatures of about 60° C. to about 80° C., reference J. R. Sheats et al., "Organic Electroluminescent Devices", *Science* 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996).

SUMMARY

This invention provides in embodiments organic light emitting devices with, in embodiments thereof, enhanced operational lifetimes. The organic light emitting devices according to embodiments of this invention can provide operational stability at high temperatures, such as, for example, an operational lifetime of several hundreds of hours, such as 1,200 hours at a high brightness of, for example, about 1,500 candelas per square meter (cd/m$^2$) at temperatures of from about 80° C. to about 100° C., which corresponds to, for example, about 10,000 hours for a typical display luminance of about 100 cd/m$^2$ at temperatures of from about 80° C. to about 100° C.

The organic light emitting devices according to the embodiments of the present invention comprise (i) a first electrode;

(ii) a mixed region comprising a first hole transport material, which material can also function as a luminescent material, and a first electron transport material, which material can also function as a luminescent material, and which mixed region can also further include an organic luminescent material, and wherein the mixed region is capable of emitting light in response to hole electron recombination;

(iii) a second electrode;

(iv) an optional thermal protective element coated usually present when the device is operated at higher temperatures, for example about equal to or about above 70° C. to about 100° C., and which element needs not be present when the device is operating at lower temperatures, such as for example, from about 20° C. to about 70° C. on one of the first and second electrodes, wherein one of the first and second electrodes is a hole injection anode, and one of the electrodes is an electron injection cathode, and wherein the organic light emitting device further comprises at least one of (v) a hole transport region, interposed or situated between the anode and the mixed region; and (vi) an electron transport region interposed between the cathode and the mixed region, and wherein a. the hole transport region, which region can be one or more layers, contains a second hole transport material at least in part, or in one layer where the hole transport region is in contact with the mixed region, and wherein the first hole transport material (ii), and the second hole transport material (vi) are not the same material or dissimilar; and b. the electron transport region, similar to a. above, comprises a second electron transport material at least in a part, reference a. above, where the electron transport region is bordering or is in contact with the mixed region, and wherein the first electron transport material and the second electron transport material are not the same material, or are dissimilar. For example, when the hole transport region contains two layers, the layer in contact with the mixed region can be dissimilar than the hole transport material of the mixed region.

The use of different electron materials in the mixed region (ii) and in the electron transport region (vi), or at least in the layer of the electron transport region where the region is bordering the mixed region, and/or the use of different hole transport materials in the mixed region (ii), the hole transport region (v), or at least in the layer of the hole transport region (v) b. ordering the mixed region can provide the organic light emitting devices with a variety of desirable features, such as, for example, (1) excellent and in embodiments increased efficiency and/or stability, (2) simple and economic fabrication, and/or (3) greater latitude in device design and materials selection. For example, the use of different electron transport materials in the mixed region and in the electron transport region, or at least in part of the electron transport region, where the electron transport region is bordering the mixed region, can be effective in increasing the efficiency of organic light emitting device by creating an energy barrier at the interface between the mixed region and the electron transport region, resulting in a substantial decrease in energy losses through exciton diffusion and subsequent quenching by the electrodes or through leakage of holes to the cathode. Similarly, the use of different hole transport materials in the mixed region and the hole transport region, or at least in the part where the hole transport region is bordering the mixed region can further increase the efficiency of the organic light emitting device. Organic light emitting devices comprising a mixed region of a hole transport material and an electron transport material results in close spatial proximity between molecules of the hole transport material and molecules of the electron transport material in these mixed regions, which can result in intermolecular interactions, and depending on the materials used, can cause undesirable side effects, such as, for example, complex formation or other exciton quenching effects, and hence can be detrimental to the efficiency or the stability of the organic light emitting device comprising such mixed layers. These material compatibility issues may limit the choice of hole transport materials and electron transport materials that can be used in forming these mixed layers. Therefore, an advantage of selecting materials in the hole transport region or the electron transport region that are different from those in the mixed region can permit a greater latitude in the selection of materials that can be used in forming the hole transport region and/or the electron transport region, and permits the use of materials that are simpler to synthesize and hence, potentially more economical.

With further respect to the EL devices of the present invention, the mixed region (ii) can contain a luminescent material or compound; also in embodiments, the hole transport material can further function as a luminescent component; the electron transport material of (ii) can also further function as a luminescent component, and moreover, the mixed region can include therein in the aforementioned embodiments a third luminescent component. In embodiments, there is added to the mixed region a separate luminescent compound.

DETAILED DESCRIPTION OF EMBODIMENTS

Figure 1:
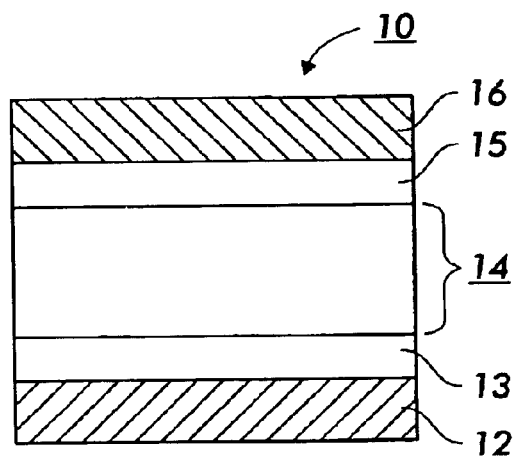
FIG. 1 illustrates an organic light emitting device.

Aspects of the present invention relate to an organic light emitting device comprising (i) a first electrode;

(ii) a mixed region comprising a first hole transport material and a first electron transport material;

(iii) a second electrode;

(iv) an optional thermal protective layer coated on one of the first and second electrodes, wherein one of the first and second electrodes is a hole injection anode, and one of the electrodes is an electron injection cathode, and wherein the organic light emitting device further comprises at least one of (v) a hole transport region interposed between the anode and the mixed region; and wherein the hole transport region is comprised of a second hole transport material, and which material is in contact with the mixed region; and (vi) an electron transport region interposed between the cathode and the mixed region, and wherein the region is comprised of a second electron material, and which material is in contact with the mixed region; and containing at least one of a. the hole transport region (v) wherein the first hole transport material (ii) is similar to or dissimilar than the second hole transport material (v);

b. the electron transport region (vi) wherein the first electron transport material (ii) is similar to or dissimilar than the second electron transport material; and wherein when a. is similar, b. is dissimilar; when a. is dissimilar, b. is similar or dissimilar; and when b. is dissimilar, a. is similar or dissimilar; an organic light emitting device wherein the electron transport region is interposed or situated between the cathode and the mixed region, the hole transport region is interposed between the anode and the mixed region, and wherein the first electron transport material and the second electron transport material are dissimilar, and wherein the first hole transport material, and the second hole transport material are dissimilar; an organic light emitting device wherein the electron transport region is interposed between the cathode and the mixed region, and the hole transport region is interposed between the anode and the mixed region, and wherein the first electron transport material and the second electron transport material are dissimilar, and wherein the first hole transport and the second hole transport material are comprised of the same components; an organic light emitting device wherein the electron transport region is situated between the cathode and the mixed region, wherein the hole transport region is interposed between the anode and the mixed region, and wherein the first electron transport material and the second electron transport material are similar, and wherein the first hole transport material and the second hole transport material are dissimilar; an organic light emitting device wherein the electron transport region is interposed between the cathode and the mixed region, wherein the organic light emitting device is free of the hole transport region, and wherein the first electron transport material and the second electron transport material are dissimilar; an organic light emitting device wherein the hole transport region is interposed between the anode and the mixed region, wherein the organic light emitting is free of an electron transport region, and wherein the first hole transport material and the second hole transport material are dissimilar; an organic light emitting device wherein at least one of a. or b. is present, and wherein the first hole transport material or the second hole transport is a component selected from the group consisting of tertiary aromatic amines, bicarbazoles, and indolocarbazoles; and wherein the first electron transport is selected from the group consisting of metal oxinoids, stilbenes, triazines, and quinolines; an organic light emitting device wherein the tertiary aromatic amine is selected from the group consisting of N,N'-di(naphthalene-1-yl)-N,N'-diphenyl-benzidine (NPB) and N,N'-bis(p-biphenyl)-N,N'-diphenyl benzidine (biphenyl TPD); wherein the indolocarbazole is selected from the group consisting of 5,11-di-naphthyl-5,11-dihydroindolo[3,2-b] carbazole and 2,8-dimethyl-5,11-di-naphthyl-5,11-dihydroindolo[3,2-b]carbazole; and wherein the metal oxinoid is selected from the group consisting of tris(8-hydroxyquinoline) aluminum ($Alq_3$) and bis(8-hydroxyquinolato)-(4-phenylphenolato)aluminum (Balq); an organic light emitting device wherein the hole transport region comprises a porphyrin; an organic light emitting device wherein the porphyrin is a metal phthalocyanine; an organic light emitting device wherein the metal phthalocyanine is copper phthalocyanine (CuPc); an organic light emitting device wherein the hole transport region comprises at least two layers; an organic light emitting device wherein the hole transport region comprises (i) a first layer contacting the anode wherein the first layer comprises a porphyrin, and (ii) a second layer contacting the mixed region wherein the second layer comprises the second hole transport material; an organic light emitting device wherein the hole transport region is comprised of a layer comprising a mixture of (i) from about 25 weight percent to about 99 weight percent of a porphyrin; and (ii) from about 75 weight percent to about 1 weight percent of the second hole transport material; an organic light emitting device wherein the electron transport region comprises at least two layers; an organic light emitting device wherein the electron transport region comprises (i) a first layer contacting the cathode, and (ii) a second layer contacting the mixed region and wherein the second layer comprises the second electron transport material; an organic light emitting device wherein there is at least one of (1) an anode comprising a layer comprised of indium-tin-oxide, and (2) a cathode comprising a layer selected from the group consisting of (a) a layer comprised of Mg and Ag; (b) a layer comprised of Al; (c) a layer comprised of indium-tin-oxide; (d) a layer comprised of an organic compound Mg and Ag; and (e) mixtures thereof; an organic light emitting device wherein the cathode further comprises an alkaline metal or a compound thereof; an organic light emitting device wherein the alkaline metal is selected from the group consisting of Li, Na, K and Cs; an organic light emitting device wherein the thermal protective layer is present, and which thermal protective layer comprises a layer of SiO, $SiO_2$ or mixtures thereof; an organic light emitting device wherein the mixed region (ii) contains a luminescent material optionally selected from the group consisting of fluorescent materials of coumarin, dicyanomethylene pyranes, polymethine, oxabenzanthrane, xanthene, pyrylium, carbostyl, perylene, acridone, quinacridone, rubrene, anthracene, coronene, phenanthracene, pyrene, butadiene, stilbene, lanthanide metal chelate complexes, and rare-earth metal chelate complexes; an organic light emitting device wherein the luminescent material is selected from the group consisting of rubrene, N,N'-dimethylquinacridone (DMQ), 10-2-(benzothiazolyl)-2,3,6,7-tetrahydro-1,1,7,7-tetramethyl-1H, 5H, 11H-(1)benzopyropyrano (6,7,-8-ij)quinolizin-11-one (C545T), and {2-(1,1-dimethylethyl)-6-(2-(2,3,6,7-tetrahydro-1,1,7,7-tetramethyl-1H,5H-benzo(ij) quinolizin-9-yl)ethenyl)-4H-pyran-4-ylidene)propanedinitrile (DCJTB); an organic light emitting device wherein the mixed region (ii) contains a luminescent material, and which luminescent material is a phosphorescent material; an organic light emitting device wherein the luminescent material is selected from the group consisting of 2,3,7,8,12,13,17,18-octaethyl-21H,23H-phorpine platinum (II) (PtOEP) and fac tris(2-phenylpyridine)iridium (Ir(ppy)₃); an organic light emitting device wherein the mixed region comprises from about 10 weight percent to about 90 weight percent of the first hole transport material, and from about 90 weight percent to about 10 weight percent of the first electron transport material, and wherein the total thereof is about 100 percent; an organic light emitting device wherein the mixed region further comprises from about 0.01 weight percent to about 50 weight percent of a luminescent material; an organic light emitting device wherein the mixed region comprises from about 25 weight percent to about 75 weight percent of the first hole transport material, and from about 75 weight percent to about 25 weight percent of the first electron transport material; an organic light emitting device wherein the mixed region further comprises from about 0.01 weight percent to about 50 weight percent of a luminescent material; an organic light emitting device wherein the first hole transport material is selected from the group consisting of N,N'-di(naphthalene-1-yl)-N,N'-diphenyl-benzidine (NPB) and N,N'-bis(p-biphenyl)-N,N'-diphenyl benzidine (biphenyl TPD); and wherein the first electron transport material is selected from the group consisting of tris(8-hydroxyquinoline) aluminum (Alq₃) and bis(8-hydroxyquinolato)-(4-phenylphenolato)aluminum (Balq); an organic light emitting device wherein the thickness of the organic light emitting device is from about 100 nanometers to about 5,000 nanometers, and wherein the thickness of the mixed region is from about 10 nanometers to about 500 nanometers; an organic light emitting device wherein the thickness of the mixed region is from about 20 nanometers to about 200 nanometers; an organic light emitting device and comprising in sequence (i) an anode;

(ii) a mixed region comprised of from about 35 weight percent to about 65 weight percent of a first hole transport material selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and from about 65 weight percent to about 35 weight percent of a first electron transport material selected from the group consisting of tris(8-hydroxyquinoline) aluminum (AlQ₃) and bis(8-hydroxyquinolato)-(4-phenylphenolato)aluminum (Balq); wherein all weight percentages are based on the total weight of materials comprising the mixed region, and wherein the thickness of the mixed region is from about 20 nanometers to about 200 nanometers;

(iii) a cathode;

(iv) a hole transport region situated between the anode and the mixed region comprised of one of (a) a layer with a thickness of from about 5 nanometers to about 100 nanometers of a second hole transport material selected from the group consisting of copper phthalocyanine (CuPc), N,N'-di(naphthalene-1-yl)-N,N'diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole; (b) a layer with thickness of from about 5 nanometers to about 100 nanometers comprised of from about 50 weight percent to about 99 weight percent of copper phthalocyanine (CuPc) and from about 50 weight percent to about 1 weight percent of a second hole transport material selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole, and (c) two layers, a first layer contacting the anode with a thickness of from about 10 nanometers to about 50 nanometers comprised of copper phthalocyanine (CuPc), and a second layer contained on the first layer with a thickness of from about 5 nanometers to about 50 nanometers and comprised of a second hole transport material selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole, and wherein the second layer contacts the mixed region;

(v) an electron transport region situated between the cathode and the mixed region, and comprised of one of (a) a layer with thickness of from about 5 nanometers to about 50 nanometers, a second electron transport material selected from the group consisting of tris(8-hydroxyquinoline)aluminum (Alq₃) and bis(8-hydroxyquinolato)-(4-phenylphenolato)aluminum (Balq), and (b) two layers, a first layer contacting the mixed region with a thickness of from about 5 nanometers to about 25 nanometers comprised of a second electron transport material selected from the group consisting of tris(8-hydroxyquinoline)aluminum (Alq₃), bis(8-hydroxyquinolato)-(4-phenylphenolato)aluminum (Balq) and 1,4-bis(4-phenylquinolin-2-yl)benzene, 4,4'-bis(4-phenylquinolin-2-yl)-1,1'-biphenyl (TA), and a second layer with a thickness of from about 5 nanometers to about 25 nanometers comprised of a material selected from the group consisting of (8-hydroxyquinoline)aluminum (Alq₃), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl and 2,4,6-tris(4-biphenylyl)-1,3,5-triazine; an organic light emitting device wherein the mixed region further comprises one of (i) from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij)quinolizin-11-one (C545T);

(ii) from about 0.2 weight percent to about 5 weight percent of (2-(1,1-dimethylethyl)-6-(2-(2,3,6,7- tetrahydro-1,1,7,7-tetramethyl-1H,5H-benzo(ij)
quinolizin-9-yl)ethenyl)-4H-pyran-4-ylidene)
propanedinitrile (DCJTB); and
(iii) from about 5 weight percent to about 15 weight percent of 2,3,7,8,12,13,17,18-octaethyl-21H,23H-phorpine platinum(II) (PtOEP) wherein all weight percentages are based on the total weight of materials comprising the mixed region; an organic light emitting comprising in sequence
(i) an anode of indium-tin-oxide with a thickness of from about 30 to about 300 nanometers coated on a substrate, the anode and the substrate being capable of transmitting at least about 70 percent of radiation of a wavelength of from about 400 nanometers to about 750 nanometers;
(ii) a mixed region comprised of from about 35 weight percent to about 65 weight percent of a first hole transport material selected from the group consisting of N,N'di(naphthalene-1-yl)-N,N'-diphenyl-benzidine (NPB) and N,N'-bis(p-biphenyl)-N,N'-diphenyl benzidine (biphenyl TPD) and from about 65 weight percent to about 35 weight percent of a first electron transport material selected from the group consisting of tris(8-hydroxyquinoline)aluminum (AlQ$_3$) and bis(8-hydroxyquinolato)-(4-phenylphenolato) aluminum (Balq) wherein all weight percentages are based on the total weight of materials comprising the mixed region, and wherein the thickness of the mixed region is from about 20 nanometers to about 200 nanometers;
(iii) a cathode comprised of one of (a) a layer comprised of Mg:Ag alloy or Al of a thickness of from about 50 nanometers to about 500 nanometers; (b) two layers, a first layer comprised of from about 40 volume percent to about 55 volume percent of Mg; from about 2 volume percent to about 10 volume percent of Ag and from about 55 volume percent to about 40 volume percent of an organic compound, wherein the thickness of the first layer is from about 100 nanometers to about 600 nanometers; and coated with a second layer of a thickness of from about 50 nanometers to about 500 nanometers and comprising a metal or a metal alloy;
(iv) a thermal protective element situated on the cathode comprised of SiO, SiO$_2$ or mixtures thereof of a thickness of from about 100 nanometers to about 1,000 nanometers;
(v) a hole transport region situated between the anode and the mixed region comprised of one of (a) a layer with a thickness of from about 5 nanometers to about 100 nanometers of a second hole transport material selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole; (b) a layer with a thickness of from about 5 nanometers to about 100 nanometers comprised of from about 50 weight percent to about 99 weight percent of copper phthalocyanine (CuPc) and from about 50 weight percent to about 1 weight percent of a second hole transport material selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole, and (c) two layers, a first layer contacting the anode, wherein the first layer possesses a thickness of from about 10 nanometers to about 50 nanometers and is comprised of copper phthalocyanine (CuPc), and the second layer in contact with the first layer, the second layer possessing a thickness of from about 5 nanometers to about 50 nanometers and comprised of a second hole transport material of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole in the second layer contacting the mixed region;
(vi) an electron transport region situated between the cathode and the mixed region comprised of one of (a) a layer with thickness of from about 5 nanometers to about 50 nanometers of a second electron transport material selected from the group consisting of tris(8-hydroxyquinoline)aluminum (Alq$_3$) and bis(8-hydroxyquinolato)-(4-phenylphenolato)aluminum (Balq), and (b) two layers, a first layer contacting the mixed region with a thickness of from about 5 nanometers to about 25 nanometers, comprised of a second electron transport material selected from the group consisting of materials including tris(8-hydroxyquinoline) aluminum (Alq$_3$), bis(8-hydroxyquinolato)-(4-phenylphenolato)aluminum (Balq) and 1,4-bis(4-phenylquinolin-2-yl) benzene, 4,4'-bis(4-phenylquinolin-2-yl)-1,1'-biphenyl (TA), and a second layer with thickness of from about 5 nanometers to about 25 nanometers comprised of a material selected from the group consisting of (8-hydroxyquinoline) aluminum (Alq$_3$), copper phthalocyanine (CuPc), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl and 2,4,6-tris(4-biphenylyl)-1,3,5-triazine; an organic light emitting device wherein the mixed region comprises at least one of
(i) from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij) quinolizin-11-one (C545T);
(ii) from about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene)propanedinitrile (DCJTB); and
(iii) from about 5 weight percent to about 15 weight percent of 2,3,7,8,12,13,17,18-octaethyl- 21H,23H-phorpine platinum(II) (PtOEP) wherein all weight percents are based on the total weight of materials comprising the mixed region; a method of forming an organic light emitting device comprising a vacuum evaporation process or spin coating; a method wherein the vacuum evaporation process is accomplished at a vacuum of from about $5\times10^{-12}$ to about $5\times10^{-3}$ millimeters Hg; an organic light emitting device wherein each of the regions (ii), (v) and (vi) are comprised of from about 1 layer to about 5 layers; an organic light emitting device wherein each of the regions (ii), (v) and (vi) are comprised of a plurality of layers; an organic light emitting device wherein the first hole transport material and the second hole transport material are dissimilar; an organic light emitting device wherein the first hole transport material and the second hole transport material are similar; an organic light emitting device wherein each of the regions (ii), (v) and (vi) are comprised of one layer; an organic light emitting device wherein the hole transport region (v) is comprised of from 1 to about 5 layers, and wherein the layer in contact with the mixed region (ii) is comprised of a dissimilar hole transport material than the first hole transport material (ii); an organic light emitting device wherein one of the first hole transport (ii) and electron transport (ii) also functions as a luminescent material; an organic light emitting device further containing in (ii) a luminescent material; an organic light emitting device wherein the electron transport region (v) is comprised of from 1 to about 5 layers, and wherein the layer in contact with the mixed region (ii) is comprised of a dissimilar electron transport material than the first electron transport material (ii); an organic light emitting device wherein the protective layer is present thereby optionally enabling device operation at low or high temperatures, which temperatures are optionally from about 20° C. to about 100° C.; an organic light emitting device wherein the device functions at a temperature of from about 22° C. to about 70° C.; an organic light emitting device wherein a. is similar and b. is dissimilar; an organic light emitting device wherein a. is dissimilar and b. is similar or dissimilar; and an organic light emitting device wherein the thermal protective layer is a silicon oxide or a silicon dioxide; and a device comprised of
(i) a first electrode;
(ii) a mixed region comprising a first hole transport material and a first electron transport material;
(iii) a second electrode;
(iv) an optional thermal protective layer coated on one of the first and second electrodes or both electrodes, wherein one of the the first and second electrodes is a hole injection anode, and one of the electrodes is an electron injection cathode, and wherein the organic light emitting device further comprises at least one of
(v) a hole transport region interposed between the anode and the mixed region; and wherein the hole transport region is comprised of a second hole transport material, and which material is in contact with the mixed region; and (vi) an electron transport region interposed between the cathode and the mixed region, and wherein the region is comprised of a second electron transport material, and which material is in contact with the mixed region; and containing at least one of
a. the hole transport region (v) wherein the first hole transport material (ii) is similar to or dissimilar than the second hole transport material (v);
b. the electron transport region (vi) wherein the first electron transport material (ii) is similar to or dissimilar than the second electron transport material; and wherein when a. is similar, b. is dissimilar; when a. is dissimilar, b. is similar or dissimilar; when b. is dissimilar, a. is similar or dissimilar.

In organic light emitting devices according to this invention the use of a hole transport region and an electron transport region are believed to achieve a more balanced charge injection process, and reduce leakage of the carriers to the counter electrodes, see Z. D. Popovic et al., *Proceedings of the SPIE*, Vol. 3176, "Organic Light-Emitting Materials and Devices II", San Diego, Calif., July 21–23, 1998, pp. 68–73, the disclosure of which is totally incorporated herein by reference, and therefore, demonstrate higher efficiency compared to a number of organic light emitting devices, such as, for example, organic light emitting devices disclosed in U.S. Pat. Nos. 5,853,905; 5,925,980; 6,114,055; and 6,130,001, the disclosures of which are totally incorporated herein by reference. Therefore, in embodiments according to this invention, the organic light emitting device can comprise a hole transport region interposed between the anode and the mixed region and an electron transport region interposed between the cathode and the mixed region. In exemplary embodiments where the organic light emitting device comprises both a hole transport region and an electron transport region, both (a) the first hole transport material comprising the mixed region and the second hole transport material comprising the hole transport region are not the same material, and (b) the first electron transport material comprising the mixed region and the second electron transport material comprising the electron transport region are not the same material. An example of an organic light emitting device according to such embodiments is illustrated in FIG. 1.

With respect to the FIGS. 1 to 5, "region" refers to a single layer, however, it is appreciated that region can be a plurality of layers.

Figures

In FIG. 1 there is illustrated an organic light emitting device 10 comprised of a first electrode 12 serving as a hole injecting anode; laminated on the first electrode 12 is a hole transport region 13 comprising a hole transport material; laminated on the hole transport region 13 is a mixed region 14 comprising a mixture of (1) a first hole transport material, and (2) a first electron transport material, and which mixed region can further comprise an organic luminescent material, such as, for example, a fluorescent or a phosphorescent material; laminated on the mixed region 14 is an electron transport region 15 comprising a second electron transport material; laminated on the electron transport region 15 is a second electrode 16, such as a cathode, serving as an electron injecting electrode; and wherein the first hole transport material comprising the mixed region 14 and a second hole transport material comprising the hole transport region 13 are not the same material, and the first electron transport material comprising the mixed region 14 and a second electron transport material comprising the electron transport region 15 are not the same material.

In embodiments where the organic light emitting device comprises both a hole transport region and an electron transport region, wherein region can be, or refers to a single layer or a plurality of layers, either (a) the first hole transport material and the second hole transport material are dissimilar materials, and the first electron transport material and the second electron transport material are the same material, or (b) the first hole transport material and the second hole transport material are the same material, whereas the first electron transport material and the second electron transport material are not the same materials. An example according to these embodiments is an organic light emitting device wherein a first hole transport material comprising the mixed region and a second hole transport material comprising the hole transport region are different materials, wherein a first electron transport material comprising the mixed region and a second electron transport material comprising the electron transport region are the same material. Another example according to these embodiments is an organic light emitting device wherein the first hole transport material comprising the mixed region and the second hole transport material comprising the hole transport region are the same material, and wherein the first electron transport material comprising the mixed region and the second electron transport material comprising the electron transport region are different materials.

Figure 2:
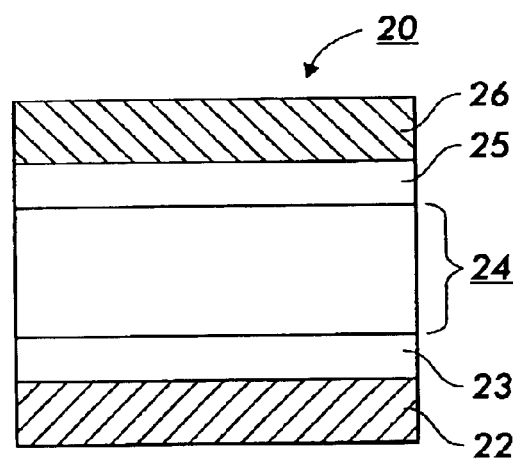
FIG. 2 illustrates a second organic light emitting device.

Illustrated in FIG. 2 is an organic light emitting device 20 comprising a first electrode 22 serving as a hole injecting anode; laminated on the first electrode 22 is a hole transport layer 23 of a thickness of from 5 nanometers to about 5,000 nanometers, layer 23 being comprised of a second hole transport material similar to the first hole transport recited herein; laminated on the hole transport region 23 is a mixed region 24, comprised of a mixture of (1) a first hole transport material, and (2) a first electron transport material, and which mixed region can further comprise an organic luminescent material, such as, for example, a fluorescent or a phosphorescent material; laminated on the mixed region 24 is an electron transport region 25 comprising a second electron transport material dissimilar than the first electron transport (iv) above; laminated on the electron transport region 25 is a second electrode 26 serving as an electron injecting cathode, thus the first hole transport material comprising the mixed region 24 and the second hole transport material comprising the hole transport region 23 are comprised of a similar material and the first electron transport material comprising the mixed region 24 and the second electron transport material comprising the electron transport region 25 are dissimilar.

Figure 3:
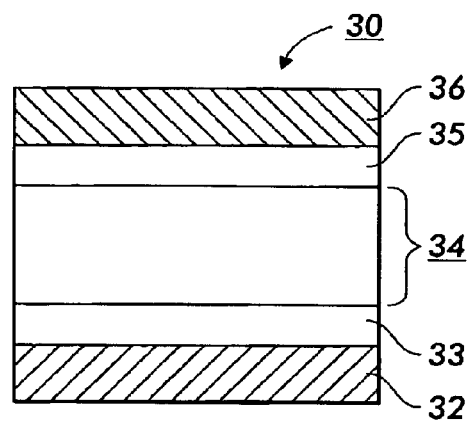
FIG. 3 illustrates a third organic light emitting device.

Illustrated in FIG. 3 is an organic light emitting device 30 comprising a first electrode 32 serving as a hole injecting anode; laminated on the first electrode 32 is a hole transport region 33 comprising a second hole transport material; laminated on the hole transport region 33 is a mixed region 34 comprising a mixture of (1) a first hole transport material, and (2) a first electron transport material, and which mixed region further comprises an organic luminescent material, such as, for example, a fluorescent or a phosphorescent material; laminated on the mixed region 34 is an electron transport region 35 comprising an electron transport material; laminated on the electron transport region 35 is a second electrode 36 serving as an electron cathode wherein, for example, the first hole transport material comprising the mixed region 34 and the second hole transport material comprising the hole transport region 33 are not the same material and the first electron transport material comprising the mixed region 34 and the second electron transport material comprising the electron transport region 35 are the same material.

Depending, for example, on the charge transport properties of the materials used, it may be desirable in embodiments for the organic light emitting device to comprise only one of the hole transport region and an electron transport region, that is the organic light emitting device would comprise a hole transport region between the anode and the mixed region with no electron transport region between the mixed region and the cathode, and wherein the mixed region is in contact with the cathode, and/or the organic light emitting device comprises an electron transport region between the mixed region and the cathode, and are free of the hole transport region between the anode and the mixed region with the mixed region contacting the anode.

Figure 4:
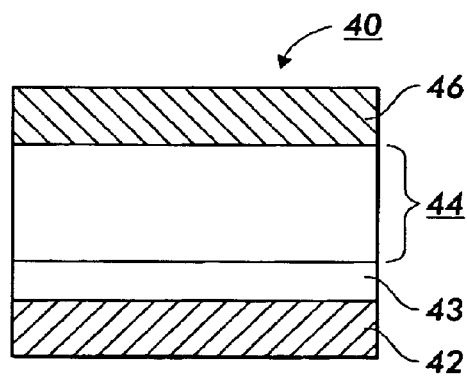
FIG. 4 illustrates a fourth organic light emitting device.

Illustrated in FIG. 4 is an organic light emitting device 40 comprising a first electrode 42 serving as a hole injecting anode; laminated on the first electrode 42 is a hole transport region 43 comprising a second hole transport material; laminated on the hole transport region 43 is a mixed region 44 comprising a mixture of (1) a first hole transport material, and (2) an electron transport material, and which mixed region can further comprise an organic luminescent material, such as, for example, a fluorescent or a phosphorescent material; laminated on the mixed region 44 is a second electrode 46 serving as an electron injecting cathode, and wherein the first hole transport material comprising the mixed region 44 and the second hole transport material comprising the hole transport region 43 are dissimilar materials.

Figure 5:
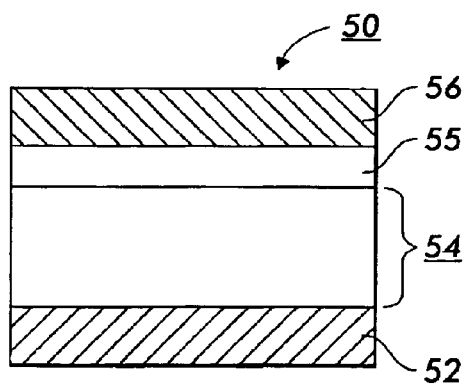
FIG. 5 illustrates a fifth organic light emitting device.

Illustrated in FIG. 5 is an organic light emitting device 50 comprised of a first electrode 52 serving as a hole injecting anode; laminated on the first electrode 52 is a mixed region 54 comprising a mixture of (1) a hole transport material, and (2) a first electron transport material, and which mixed region can further comprise an organic luminescent material, such as, for example, a fluorescent or a phosphorescent material; laminated on the mixed region 54 is an electron transport region 55 comprising a second electron transport material; laminated on the electron transport region 55 is a second electrode 56 serving as an electron injecting electrode; and wherein the first electron transport material comprising the mixed region 54 and the second electron transport material comprising the electron transport region 55 are not the same material.

The optional thermal protective element, reference copending application U.S. Ser. No. 09/770,154, the disclosure of which is totally incorporated herein by reference, can be laminated on the first electrode or on the second electrode. An example of such an organic light emitting device, illustrated in FIGS. 1 to 5, 10, 20, 30, 40, 50 would comprise a thermal protective element or layer laminated on the cathode 16, 26, 36, 46, 56, and/or laminated on the anode 12, 22, 32, 42, 52.

In aspects of the present invention, the organic light emitting devices 10, 20, 30, 40, 50 comprise a hole transport region 13, 23, 33, 43 containing a buffer layer comprised of, for example, a porphyrin, such as, for example, copper phthalocyanine (CuPc), and wherein the buffer layer is located, for example, in contact with the anode 12, 22, 32, 42, 52, reference copending application U.S. Ser. No. 09/770,159, the disclosure of which is totally incorporated herein by reference, which layer can improve the stability of the organic light emitting devices 10, 20, 30, 40, 50, and more particularly, can reduce the increase in the driving voltage of the organic light emitting device when the organic light emitting device is operated at high temperatures, such as, for example, temperatures of from about 70° C. to about 100° C., over an extended time, such as, for example, hundreds or thousands of hours as indicated herein. The hole transport regions 13, 23, 33, 43 in organic light emitting devices 10, 20, 30, 40 can be comprised of a layer comprising from about 50 weight percent to about 99 weight percent of a porphyrin, and from about 50 weight percent to about 1 weight percent of a hole transport material, such as, for example, those materials disclosed in copending application U.S. Serial No. (not yet assigned—D/A1406), the disclosure of which is totally incorporated herein by reference; thus the hole transport regions 13, 23, 33, 43 can be comprised of a layer comprising from about 50 weight percent to about 99 weight percent of a porphyrin, and from about 50 weight percent to about 1 weight percent of a hole transport material, and which material can improve the stability of the organic light emitting devices 10, 20, 30, 40, 50, and more particularly, which material can be effective in reducing the increase in the driving voltage of the organic light emitting device when the organic light emitting device is operated at high temperatures, such as, for example, temperatures from about 75° C. to about 105° C., over extended periods of hours, such as, for example, several hundreds, or even several thousands of hours; the electron transport regions 15, 25, 35, 55 between the mixed regions 14, 24, 34, 54 and the cathodes 16, 26, 36, 56 can comprise a plurality of separate layers of, for example, from two to about ten, and more specifically, two or three, reference for example U.S. Ser. No. 09/770,159, filed on Jan. 26, 2001, and copending applications U.S. Serial No. (not yet assigned—D/A1407), U.S. Serial No. (not yet assigned—D/A1406), U.S. Serial No. (not yet assigned—D/A1393), and U.S. Serial No. (not yet assigned—D/A1581), filed concurrently herewith; thus the multiple-layered electron transport regions 15, 25, 35, 55 can result in several desirable effects, such as improving the injection of the carriers into the mixed regions 14, 24, 34, 54, reducing the operating voltage and increasing efficiency and/or stability of the organic light emitting devices 10, 20, 30, 50. The electroluminescent device wherein one of the first electrode and second electrode comprises a metal-organic mixed region include (i) a metal first component, such as, for example, Mg; (ii) an organic material second component, such as, for example, AlQ$_3$; and (iii) at least one third component selected from the group consisting of metals, organic materials and inorganic materials, such as, for example Ag, reference copending patent application U.S. Ser. No. 09/800,716, the disclosure of which is totally incorporated herein by reference, and more specifically, the cathodes 16, 26, 36, 46, 56 of the organic light emitting devices 10, 20, 30, 40, 50 can comprise a metal-organic mixed region including (i) a metal first component, such as, for example Mg; (ii) an organic material second component, such as, for example AlQ$_3$; and (iii) at least one third component selected from the group consisting of metals, organic materials and inorganic materials, such as, for example Ag, reference copending patent application U.S. Ser. No. 09/800,716, resulting in a number of desirable properties, such as an increased contrast, better visibility and higher environmental stability of displays utilizing organic light emitting devices. Also disclosed is an electroluminescent device operating under alternating current (AC) and/or direct current (DC) driving conditions with AC driving conditions being at an operating voltage of, for example, from about 3 to about 20 volts, and more specifically, from about 5 to about 15 volts; for driving currents of, for example, from about 1 to about 1,000 mA/cm$^2$ density, and more specifically, from about 10 mA/cm$^2$ to about 200 mA/cm$^2$.

The electrode, such as anodes 12, 22, 32, 42, 52, can comprise suitable positive charge injecting electrodes such as indium tin oxide (ITO), silicon, tin oxide, gold, platinum, and the like. Other suitable anode materials include, but are not limited to, electrically conductive carbon, π-conjugated polymers such as polyaniline, polythiophene, polypyrrole, and the like with, for example, a work function equal to, or greater than about 4 eV, and more specifically, from about 4 eV to about 6 eV. The anodes 12, 22, 32, 42, 52 can be of any suitable form, and as an anode a conductive layer can be coated onto a light transmissive substrate, for example a transparent or substantially transparent glass plate or plastic film, for example the anode can be a light transmissive anode formed from tin oxide or indium tin oxide (ITO) coated on a glass plate. Also, thin light-transparent metallic anodes having a thickness, for example, of less than about 200 Å, and, more specifically, from about 75 Å to about 150 Å can be selected. These thin anodes can comprise metals such as gold, palladium and the like. In addition, transparent or semi-transparent thin layers of conductive carbon or conjugated polymers, such as polyaniline, polythiophene, polypyrrole and the like, having a thickness of, for example, from 50 Å to about 175 Å can be selected as anodes. Additional suitable forms of the anodes 12, 22, 32, 42, 52, and the cathodes 16, 26, 36, 46, 56 are disclosed in U.S. Pat. No. 4,885,211, the disclosure of which is totally incorporated herein by reference.

The thickness of the anodes 12, 22, 32, 42, 52 can be from about 1 nanometer to about 5,000 nanometers with the specific thickness being dependent on the optional components of the anode. One specific thickness range for the anode is from about 30 nanometers to about 300 nanometers. Throughout, thicknesses outside of the values recited can also be used.

Examples of hole transport materials, such as the second hole transport material of regions 13, 23, 33, 43 on the anodes 12, 22, 32, 42 and the first hole transport material of the mixed regions 14, 24, 34, 44 can comprise a number of suitable known or later developed materials, such as conductive materials like polyaniline and its acid-doped forms, polypyrrole, poly(phenylene vinylene), and known semiconductive organic materials; porphyrin derivatives, such as 1,10,15,20-tetraphenyl-21H,23H-porphyrin copper (II) disclosed in U.S. Pat. No. 4,356,429, the disclosure of which is totally incorporated herein by reference, copper phthalocyanine, copper tetramethyl phthalocyanine; zinc phthalocyanine; titanium oxide phthalocyanine; magnesium phthalocyanine; and the like, and mixtures thereof A specific class of hole transporting materials are the aromatic tertiary amines such as those disclosed in U.S. Pat. Nos. 4,539,507; 4,720,432 and 5,061,569, the disclosures of which are totally incorporated herein by reference, such as bis(4-dimethylamino-2-methylphenyl)phenylmethane, N,N,N-tri (p-tolyl)amine, 1,1-bis(4-di-p-tolylaminophenyl) cyclohexane, 1,1-bis(4-di-p-tolylaminophenyl)-4-phenyl cyclohexane, N,N'-diphenyl-N,N'-bis(3-methylphenyl)-1,1'-biphenyl-4,4'-diamine, N,N'-diphenyl-N,N'-bis(3-methylphenyl)-1,1'-biphenyl4,4'-diamine, N,N'-diphenyl-N, N'-bis(4-methoxyphenyl)-1,1'-biphenyl4,4'-diamine, N,N, N',N'-tetra-p-tolyl-1,1'-biphenyl4,4'-diamine, and N,N'-di-1-naphthyl-N,N'-diphenyl-1,1'-biphenyl-4,4'-diamine. Other illustrative examples of tertiary aromatic amines are N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N'-di-1-naphthyl-N,N'-diphenyl-1,1'-biphenyl-4,4'-diamine, which is more preferred; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like Preferred hole transport materials also include N,N'-di(naphthalene-1-yl)-N,N'-diphenyl-benzidine (NPB), N,N'-bis(p-biphenyl)-N,N'-diphenyl benzidine (biphenyl TPD) and derivatives thereof.

Examples of aromatic tertiary amines selected for the hole transport regions 13, 23, 33, 43 and also for the mixed regions 14, 24, 34, 44, 54 are polynuclear aromatic amines, such as N,N-bis-[4'-(N-phenyl-N-m-tolylamino)-4-biphenylyl]aniline; N,N-bis-[4'-(N-phenyl-N-m-tolylamino)4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof, and the like; 4,4'-bis(9-carbazolyl)-1,1'-biphenyl compounds like 4,4'-bis(9-carbazolyl)-1,1'-biphenyl compounds include 4,4'-bis(9-carbazolyl)-1,1'-biphenyl and 4,4'-bis(3-methyl-9-carbazolyl)-1,1'-biphenyl, and the like, with a preferred class of the hole transport materials being the indolo-carbazoles, such as those described in U.S. Pat. Nos. 5,942,340 and 5,952,115, the disclosures of which are totally incorporated herein by reference, such as, for example 5,11-di-naphthyl-5,11-dihydroindolo[3,2-b]carbazole and 2,8-dimethyl-5,11-di-naphthyl-5,11-dihydroindolo[3,2-b]carbazole; N,N,N',N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N',N'-tetraarylbenzidine are N,N-di-1-naphthyl-N,N'-diphenyl-1,1'-biphenyl4,4'-diamine, which is more preferred; N,N'-bis(3-methylphenyl)-N,N'-diphenyl-1,1'-biphenyl4,4'-diamine; N,N'-bis(3-methoxyphenyl)-N,N'-diphenyl-1,1'-biphenyl4,4'-diamine, and the like.

In embodiments, the hole transport regions 13, 23, 33, 43 comprise a layer of a mixture of a porphyrin and a hole transport material, such as, for example, a tertiary aromatic amine or an indolocarbazole, and wherein the hole transport region can be formed of a layer comprising a mixture of a porphyrin, such as, for example, copper phthalocyanine (CuPc), and a hole transport material, such as for example, an indolocarbazole, or a tertiary aromatic amine, such as, for example, di(naphthalene-1-yl)-N,N'-diphenyl-benzidine (NPB) or N,N'-bis(p-biphenyl)-N,N'-diphenyl benzidine (biphenyl TPD).

The hole transport regions 13, 23, 33, 43 can further comprise an optional buffer layer comprised of a material with hole injection and transport properties, and selected such that device performance may be improved, reference copending patent application U.S. Ser. No. 09/770,159, the disclosure of which is totally incorporated herein by reference. Suitable materials that can be utilized in the buffer layer include semiconductive organic materials, such as, for example, porphyrin derivatives like 1,10,15,20-tetraphenyl-21H,23H-porphyrin copper (II) disclosed in U.S. Pat. No. 4,356,429, the disclosure of which is totally incorporated herein by reference; copper phthalocyanine, copper tetramethyl phthalocyanine; zinc phthalocyanine; titanium oxide phthalocyanine; magnesium phthalocyanine; and the like, and mixtures thereof; semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides like LiF, KCl, NaCl, CsCl, CsF and KF. The hole transport regions 13, 23, 33, 43, including the optional buffer layer, can be prepared by forming, for example, one of the above-recited materials into thin films by any suitable known or later developed method. Suitable methods for this purpose include, for example, vapor deposition and spin-coating techniques. The optional buffer layer can be located at any position within the hole transport regions 13, 23, 33, 43, that is it can be located such that one surface of the optional buffer layer coincides with one surface of the hole transport regions 13, 23, 33, 43; in this situation the optional buffer layer is contacting either the anodes 12, 22, 32, 42 or the mixed regions 14, 24, 34, 44; or it can be located such that the two surfaces of the buffer layer are in between the two surfaces of the hole transport regions 13, 23, 33, 43. However, in preferred embodiments, the buffer layer is located in contact with the anodes 12, 22, 32, 42.

The hole transport regions 13, 23, 33, 43, including the optional buffer layer, can be of a thickness of, for example, from about 5 nanometers to about 500 nanometers with the optional buffer layer being of a thickness of from about 1 nanometer to about 100 nanometers. In embodiments, the thickness of the optional buffer layer is at least 1 nanometer less than the thickness of the hole transport regions 13, 23, 33, 43 with a specific thickness for the buffer layer being from about 5 nanometers to about 25 nanometers, or from about 1 nanometer to about 5 nanometers. A desirable thickness for the hole transport regions 13, 23, 33, 43 exclusive of the thickness of the optional buffer layer (the remaining thickness of the hole transport region after the thickness of the buffer layer is subtracted) is from about 5 nanometers to about 15 nanometers, or the hole transport region exclusive of the thickness of the optional buffer layer is from about 15 nanometers to about 75 nanometers. Of course, a thickness outside of these ranges can also be used.

In addition to the hole transport material, the mixed regions 14, 24, 34, 44, 54 further comprises an electron transport material. Optionally, at least one of the hole transport material and the electron transport material used in forming the mixed region can be a luminescent material. Furthermore, the mixed region can further comprise a luminescent material.

Illustrative examples of electron transport materials for the electron transport regions 15, 25, 35, 55 situated, for example, on the mixed regions 14, 24, 34, 54 include the metal oxinoids as disclosed in U.S. Pat. Nos. 4,539,507; 5,151,629; 5,150,006, 5,141,671, and 5,846,666, the disclosures of each being totally incorporated herein by reference. Illustrative specific examples include tris(8-hydroxyquinolinate) aluminum ($Alq_3$), bis(8-hydroxyquinolato)-(4-phenylphenolato)aluminum (Balq). Other examples include tris(8-hydroxyquinolinate) gallium, bis(8-hydroxyquinolinate) magnesium, bis(8-hydroxyquinolinate) zinc, tris(5-methyl-8- hydroxyquinolinate) aluminum, tris(7-propyl-8-quinolinato) aluminum, bis[benzo{f}-8-quinolinate]zinc, bis(10-hydroxybenzo[h] quinolinate) beryllium, and the like. Another suitable class of electron transport materials that can be used in the mixed regions 14, 24, 34, 44, 54 and also in the electron transport region 15, 25, 35, 55 are stilbene derivatives, such as those disclosed in U.S. Pat. No. 5,516,577, the disclosure of which is totally incorporated herein by reference.

Further examples of electron transport materials that can be used in the mixed regions 14, 24, 34, 44, 54 and also in the electron transport regions 15, 25, 35, 55 are the metal thioxinoid compounds, illustrated in U.S. Pat. No. 5,846,666, the disclosure of which is totally incorporated herein by reference, such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like. Specific materials, compounds or components for the electron transport layer are bis(8-quinolinethiolato)zinc, bis(8-quinolinethiolato)cadmium, tris(8-quinolinethiolato)gallium, tris(8-quinolinethiolato)indium and bis[benzo{f}-8-quinolinethiolato]zinc. Another suitable class of electron transport materials that can be selected for the mixed regions 14, 24, 34, 44, 54 and the electron transport regions 15, 25, 35, 55 are the oxadiazole metal chelates disclosed in incorporated U.S. Pat. No. 5,925,472, which materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato]beryllium; bis[5-biphenyl-2-(2-hydroxyphenyl)-1,3,4-oxadiazolato]zinc; bis[5-biphenyl-2-(2-hydroxyphenyl)-1,3,4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato]beryllium; bis[5-(4-chlorophenyl)-2-(2-hydroxyphenyl)-1,3,4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-α-(2-hydroxynaphthyl)-5-phenyl-1,3,4-oxadiazolato]zinc; bis[2-(2-hydroxyphenyl)-5-p-pyridyl-1,3,4-oxadiazolato]zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato]beryllium, and the like. Other suitable class of electron transport materials that can be used in the mixed regions 14, 24, 34, 44, 54 and also in the electron transport regions 15, 25, 35, 55 are the quinolines, such as, for example, 1,4-bis(4-phenylquinolin-2-yl)benzene, 4,4'-bis(4-phenylquinolin-2-yl)-1,1'-biphenyl (TA); triazines as described in U.S. Pat. No. 6,057,048 and U.S. Pat. No. 6,229,012, the disclosures of which are incorporated herein by reference, such as, for example, 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl, 2,4,6-tris(4-biphenylyl)-1,3,5-triazine, and the like.

Typically, the mixed regions 14, 24, 34, 44, 54 comprise from about 20 weight percent to about 80 weight percent of the hole transport material, and from about 80 weight percent to about 20 weight percent of the electron transport material. More specifically, each of the mixed regions 14, 24, 34, 44, 54 comprises, for example, from about 35 weight percent to about 65 weight percent of the hole transport material, and from about 65 weight percent to about 35 weight percent of the electron transport material. Furthermore, in embodiments where the mixed region further contains a luminescent material, the mixed regions 14, 24, 34, 44, 54 can comprise, for example, from about 0.01 weight percent to about 10 weight percent of a fluorescent luminescent material or from about 0.01 weight percent to about 25 weight percent of a phosphorescent luminescent material, or other luminescent materials where all weight percentages are based on the total weight of materials comprising the mixed region.

Illustrative examples of luminescent materials for the mixed regions 14, 24, 34, 44, 54 include fluorescent dyes, such as, for example those disclosed in U.S. Pat. No. 4,769,292, the disclosure of which is totally incorporated herein by reference, like coumarin, dicyanomethylene pyranes, polymethine, oxabenzanthrane, xanthene, pyrylium, carbostyl, perylene, and the like; dyes selected from the quinacridone derivatives of, for example, the formula

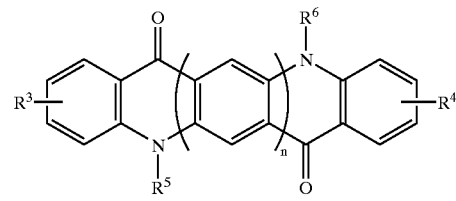

wherein $R^3$ and $R^4$ are independently hydrogen, alkyl, alkoxyl, aryl, fused aryl, such as naphthyl, or halogen; $R^5$ and $R^6$ are independently hydrogen, alkyl or aryl; and n equals 0, 1, 2 or 3. Illustrative examples of suitable quinacridone dyes include N,N'-dimethylquinacridone, N,N'-dimethyl-2-methyl quinacridone, N,N'-dimethyl-2,9-dimethylquinacridone, N,N'-dimethyl-2-chloroquinacridone, N,N'-dimethyl-2-fluoroquinacridone, and N,N'-dimethyl-1,2-benzoquinacridone. Further, fluorescent materials are the quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethyl quinacridone, N,N'-dimethyl-2-chloroquinacridone, N,N'-dimethyl-2-fluoroquinacridone, N,N'-dimethyl-1,2-benzoquinacridone, and the like, as described in U.S. Pat. Nos. 5,227,252; 5,276,381 and 5,593,788, the disclosures of which are each totally incorporated herein by reference; the fused ring fluorescent dyes, such as perylene, rubrene, anthracene, coronene, phenanthracene, pyrene and the like, as described in U.S. Pat. No. 3,172,862, the disclosure of which is totally incorporated herein by reference; butadienes, such as 1,4-diphenylbutadiene and tetraphenylbutadiene, and stilbenes and the like, as described in U.S. Pat. Nos. 4,356,429 and 5,516,577, the disclosures of which are totally incorporated herein by reference; components as illustrated in U.S. Pat. No. 5,601,903, the disclosure of which is totally incorporated herein by reference; and in U.S. Pat. No. 5,935,720, the disclosure of which is totally incorporated herein by reference, such as, for example, 4-(dicyanomethylene)-2-1-propyl-6-(1,1,7,7-tetramethyljulolidyl-9-enyl)-4H-pyran and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene)propanedinitrile (DCJTB) are coumarins of the formula

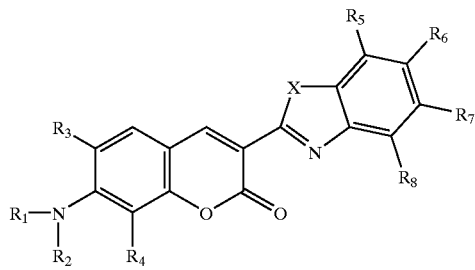

wherein X is selected from the group consisting of oxygen atom, sulfur atom, alkyl imino group ($R_9$—N=, wherein $R_9$ is an alkyl group with from about 1 to about 10 carbons), and aryl imino group (Ar—N=, wherein Ar is a phenyl group); $R_1$ and $R_2$ are individually selected from the group consisting of: alkyl of from 1 to 20 carbon atoms, aryl, and carbocyclic systems; $R_3$ and $R_4$ are individually selected from the group consisting of hydrogen atom, alkyl of from 1 to 10 carbon atoms, and a branched or unbranched 5 or 6 member substituent ring connecting with $R_1$, $R_2$, respectively; and $R_5$, $R_6$, $R_7$, and $R_8$ are individually selected from the group consisting of hydrogen atom, alkoxy group of from 1 to 10 carbon atoms and alkyl group of from 1 to 20 carbon atoms. A preferred example of a coumarin dye is 10-2-(benzothiazolyl)-2,3,6,7-tetrahydro-1,1,7,7-tetramethyl-1H, 5H, 11H-(1)benzopyropyrano (6,7,-8-i j) quinolizin-11-one (C545T), and others as disclosed in U.S. Pat. No. 6,020,078, the disclosure of which is totally incorporated herein by reference; the lanthanide metal chelate complexes, such as for examples, tris(acetylacetonato)(phenanthroline) terbium, tris(acetyl acetonato)(phenanthroline) europium, and tris(thenoyl trisfluoroacetonato)(phenanthroline) europium, as those disclosed in Kido et al., "White light emitting organic electroluminescent device using lanthanide complexes", Jpn. J. App. Phys., Volume 35, pp. L394–L396 (1996); phosphorescent materials, such as, for example, organometallic compounds containing a heavy metal atom that can result in strong spin-orbit coupling, such as disclosed in Baldo et. al., "Highly efficient organic phosphorescent emission from organic electroluminescent devices", Letters to Nature, Volume 395, pp 151–154 (1998). Preferred examples include 2,3,7,8,12,13,17,18-octaethyl-21H,23H-phorpine platinum (II) (PtOEP) and others, such as, for example, those disclosed in U.S. Pat. No. 6,048,630, the disclosure of which is totally incorporated herein by reference, and fac tris(2-phenylpyridine)iridium ($Ir(ppy)_3$).

The mixed regions 14, 24, 34, 44, 54 can each possess a thickness of from about 10 nanometers to about 2,000 nanometers, and more specifically, each of the mixed regions 14, 24, 34, 44, 54 can have a thickness of from about 50 nanometers to about 200 nanometers. The mixed regions 14, 24, 34, 44, 54 can be formed by any suitable method that enables, for example, the formation of selected mixtures of the hole transport material, the electron transport material and the optional luminescent material. For example, the mixed regions 14, 24, 34, 44, 54 can be formed by co-evaporating the hole transport material, the electron transport material, and the optional luminescent material.

The electron transport regions 15, 25, 35, 55 can comprise an electron transport material and which region is, for example, of a thickness of from about 1 nanometers to about 100 nanometers, and more specifically, from about 5 nanometers to about 50 nanometers. A thickness outside of these ranges can also be used. In embodiments where the organic light emitting devices comprise a multiple-layered electron transport regions 15, 25, 35, 55, the individual layers have a thickness of at least about 1 nanometer.

The electrode, such as the cathodes 16, 26, 36, 46, 56 formed, for example, on the electron transport regions 15, 25, 35, 55 or the mixed region 44, can comprise suitable electron injecting materials such as metals, including high work function components, such as metals with, for example, a work function from about 4 eV to about 6 eV, or low work function components, such as metals with, for example, a work function of from about 2 eV to about 4 eV. The cathodes 16, 26, 36, 46, 56 can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals, such as lithium or sodium; Group 2A or alkaline earth metals, such as beryllium, magnesium, calcium or barium; and Group III metals including rare earth metals and the actinide group metals, such as scandium, yttrium, lanthanum, cerium, europium, terbium or actinium. Lithium, magnesium and calcium are preferred low work function metals. The Mg-Ag alloy cathodes described in U.S. Pat. No. 4,885,211 and U.S. Pat. No. 4,720,432, the disclosures of which are totally incorporated herein by reference, recite examples of specific cathode materials for forming the cathodes 16, 26, 36, 46, 56; also cathodes are described in copending patent application U.S. Ser. No. 09/800,716, filed on Mar. 8, 2001, the disclosure of which is totally incorporated herein by reference, such as a metal-organic mixed region including (i) a metal first component, such as, for example, Mg; (ii) an organic material second component, such as, for example, $AlQ_3$; and (iii) at least one third component selected from the group consisting of metals, organic materials and inorganic materials, such as, for example Ag; and the cathodes of U.S. Pat. No. 5,429,884, the disclosure of which is totally incorporated herein by reference, formed, for example, from lithium alloys with other high work function metals such as aluminum and indium; cathodes can also include electron injection layer in contact with the electron transport regions 15, 25, 35, 55 or the mixed region 44 of an insulative material, such as an oxide material or an alkaline metal compound as described in U.S. Pat. Nos. 5,457,565; 5,608,287 and 5,739,635, the disclosures of which are each totally incorporated herein by reference, wherein the thickness of the cathodes 16, 26, 36, 46, 56 can be from, for example, about 10 nanometers to about 1,000 nanometers.

The thermal protective element can be formed on the cathodes 16, 26, 36, 46, 56 or the anodes 12, 22, 32, 42, 52. Examples of thermal protective elements are disclosed in copending applications U.S. Ser. Nos. 09/770,159 and 09/770,154, the disclosures of which are totally incorporated herein by reference. Typically, the thermal protective element comprises a layer comprised of SiO, $SiO_2$ or mixtures thereof, and with thickness of, for example, from about 300 nanometers to about 5,000 nanometers.

The following Examples are provided to further illustrate various aspects of the present invention, and are not intended to limit the scope of the invention. "Region" refers to one layer except as indicated.

EXAMPLE I

Eight Separate Organic Light Emitting Devices Were Fabricated and Tested as Follows A first organic light emitting device (I-A) with a structure, such as device 10 in FIG. 1, was formed and evaluated. The hole transport region 13 was comprised of copper phthalocyanine (CuPc) as the second hole transport material. The mixed region 14 was comprised of about 50 weight percent of N,N'di(naphthalene-1-yl)-N,N'-diphenyl-benzidine (NPB) and about 50 weight percent of (8-hydroxyquinoline) aluminium ($Alq_3$), as the first hole transport material and the first electron transport material, respectively. The electron transport region 15 was comprised of two layers, a first layer contacting the mixed region comprised of 1,4-bis(4-phenylquinolin-2-yl)benzene, 4,4'-bis(4-phenylquinolin-2-yl)-1,1'-biphenyl (TA) as the second electron transport material, and a second layer contacting the cathode 16 comprised of tris(8-hydroxyquinoline) aluminium ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole-transport region 13, the mixed region 14 and the electron-transport region 15 were formed between an anode 12 comprised of indium-tin-oxide (ITO) having a thickness of about 200 nanometers, precoated on a glass substrate; and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

A second organic light emitting device (I-B) with a structure, such as device 10 in FIG. 1, was formed and evaluated. The hole transport region 13 was comprised of 5,11-di-naphthyl-5,11-dihydroindolo[3,2-b]carbazole (NIC) as the second hole transport material. The mixed region 14 was comprised essentially of about 50 weight percent of N,N'-di(naphthalene-1-yl)-N,N'-diphenyl-benzidine (NPB) and about 50 weight percent of (8-hydroxyquinoline) aluminium ($Alq_3$) used as the first hole transport material and the first electron transport material, respectively. The electron transport region 15 was comprised of two layers, a first layer contacting the mixed region comprised of 1,4-bis(4-phenylquinolin-2-yl)benzene, 4,4'-bis(4-phenylquinolin-2-yl)-1,1'-biphenyl (TA), and used as the second electron transport material, and a second layer contacting the cathode 16 comprised essentially of tris(8-hydroxyquinoline) aluminium ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole-transport region 13, the mixed region 14 and the electron-transport region 15 were formed between an anode 12 comprised of indium-tin-oxide (ITO) having a thickness of about 200 nanometers precoated on a glass substrate; and a cathode 16 comprised of an Mg:Ag (10:1 by weight) alloy having a thickness of about 120 nanometers. A thermal protective element comprised of silicon monoxide (SiO) and having a thickness of about 200 nanometers was coated on the cathode 16.

A third organic light emitting device (I-C) having a structure, such as the device 10 in FIG. 1, was formed and evaluated. The hole transport region 13 was comprised of 5,11-di-naphthyl-5, 11-dihydroindolo[3,2-b]carbazole (NIC) as the second hole transport material. The mixed region 14 was comprised essentially of about 50 weight percent of N,N'-bis(p-biphenyl)-N,N'-diphenyl benzidine (biphenyl TPD) about 50 weight percent of (8-hydroxyquinoline) aluminum ($Alq_3$) as the first hole transport material and the first electron transport material, respectively. The electron transport region 15 was comprised of two layers, a first layer contacting the mixed region comprised essentially of 1,4-bis(4-phenylquinolin-2-yl) benzene, 4,4'-bis(4-phenylquinolin-2-yl)-1,1'-biphenyl (TA), and used as the second electron transport material, and a second layer contacting the cathode 16 comprised essentially of tris(8-hydroxyquinoline) aluminum ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole-transport region 13, the mixed region 14 and the electron-transport region 15 were formed between an anode 12 comprised of indium-tin-oxide (ITO) having a thickness of about 200 nanometers, precoated on a glass substrate; and a cathode 16 comprised of an Mg:Ag (10:1 by weight) alloy having a thickness of about 120 nanometers. A thermal protective element comprised of silicon monoxide (SiO) and having a thickness of about 200 nanometers was coated on the cathode 16.

A fourth organic light emitting device (I-D) having a structure, such as the device 10 in FIG. 1, was formed and evaluated. The hole transport region 13 was comprised of 5,11-di-naphthyl-5,11-dihydroindolo[3,2-b]carbazole (NIC) as the second hole transport material. The mixed region 14 was comprised essentially of about 49.8 weight percent of N,N'-di(naphthalene-1-yl)-N,N'-diphenyl-benzidine (NPB) about 49.8 weight percent of (8-hydroxyquinoline) aluminum ($Alq_3$) used as the first hole transport material and the first electron transport material, respectively, and further comprised about 0.4 weight percent of rubrene fluorescent material. The electron transport region 15 was comprised of two layers, a first layer contacting the mixed region comprised of 1,4-bis(4-phenylquinolin-2-yl)benzene, 4,4'-bis(4-phenylquinolin-2-yl)-1,1'-biphenyl (TA), and the second electron transport material, and a second layer contacting the cathode 16 comprised essentially of tris(8-hydroxyquinoline) aluminum ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole-transport region 13, the mixed region 14 and the electron-transport region 15 were formed between an anode 12 comprised of indium-tin-oxide (ITO) having a thickness of about 200 nanometers, precoated on a glass substrate; and a cathode 16 comprised of an Mg:Ag (10:1 by weight) alloy having a thickness of about 120 nanometers. A thermal protective element comprised of silicon monoxide (SiO) and having a thickness of about 200 nanometers was coated on the cathode 16.

A fifth organic light emitting device (I-E) having a structure, such as the device 30 in FIG. 3, was formed and evaluated. The hole transport region 33 was comprised of 5,11-di-naphthyl-5,11-dihydroindolo[3,2-b]carbazole (NIC) as the second hole transport material. The mixed region 34 was comprised of about 44 weight percent of N,N'-di (naphthalene-1-yl)-N,N'-diphenyl-benzidine (NPB), about 44 weight percent of (8-hydroxyquinoline) aluminum ($Alq_3$) used as the first hole transport material and the first electron transport material, respectively, and further comprised of about 12 weight percent of 2,3,7,8,12,13,17,18-octaethyl-21H,23H-phorpine platinum(II) (PtOEP) phosphorescent material. The electron transport region 35 was comprised of tris(8-hydroxyquinoline) aluminum ($Alq_3$) used as the second electron transport region. The thickness of the hole transport region was about 25 nanometers, the thickness of the mixed region was about 80 nanometers, the thickness of the electron transport region was about 20 nanometers, and the hole transport region 33, the mixed region 34 and the electron transport region 35 were formed between an anode 32 comprised of indium-tin-oxide (ITO) having a thickness of about 200 nanometers, precoated on a glass substrate; and a cathode 36 comprised of a Mg:Ag (10:1 by weight) alloy having a thickness of about 120 nanometers. A thermal protective element comprised of silicon monoxide (SiO) and having a thickness of about 200 nanometers was coated on the cathode 36.

A sixth organic light emitting device (I-F) having a structure, such as the device 10 in FIG. 1, was formed and evaluated. The hole transport region 13 was comprised of 5,11-di-naphthyl-5,11-dihydroindolo[3,2-b]carbazole (NIC) as the second hole transport material. The mixed region 14 was comprised of about 49.6 weight percent of N,N'-di (naphthalene-1-yl)-N,N'-diphenyl-benzidine (NPB), about 49.6 weight percent of (8-hydroxyquinoline) aluminum ($Alq_3$) used as the first hole transport material and the first electron transport material, respectively, and further comprised about 0.8 weight percent of 10-2-(benzothiazolyl)-2,3,6,7-tetrahydro-1,1,7,7-tetramethyl-1H, 5H, 11H-(1) benzopyropyrano (6,7,-8-i j) quinolizin-11-one (C545T) fluorescent material. The electron transport region 15 was comprised of two layers, a first layer contacting the mixed region comprised of 1,4-bis(4-phenylquinolin-2-yl)benzene, 4,4'-bis(4-phenylquinolin-2-yl)-1,1'-biphenyl (TA), and used as the second electron transport material, and a second layer contacting the cathode 16 comprised essentially of tris(8-hydroxyquinoline) aluminum ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole transport region 13, the mixed region 14 and the electron transport region 15 were formed between an anode 12 comprised of indium-tin-oxide (ITO) having a thickness of about 200 nanometers, precoated on a glass substrate; and a cathode 16 comprised of an Mg:Ag (10:1 by weight) alloy having a thickness of about 120 nanometers. A thermal protective element comprised of silicon monoxide (SiO) and having a thickness of about 200 nanometers was coated on the cathode 16.

A seventh organic light emitting device (I-G) having a structure, such as the device 10 in FIG. 1, was formed and evaluated. The hole transport region 13 was comprised of N,N'-bis(p-biphenyl)-N,N'-diphenyl benzidine (biphenyl TPD) as the second hole transport material. The mixed region 14 was comprised of about 49.8 weight percent of N,N'-di(naphthalene-1-yl)-N,N'-diphenyl-benzidine (NPB) about 49.8 weight percent of (8-hydroxyquinoline) aluminum ($Alq_3$) used as the first hole transport material and the first electron transport material, respectively, and further comprised about 0.4 weight percent rubrene fluorescent material. The electron transport region 15 was comprised of two layers, a first layer contacting the mixed region comprised of 1,4-bis(4-phenylquinolin-2-yl)benzene, 4,4'-bis(4-phenylquinolin-2-yl)-1,1'-biphenyl (TA), and used as the second electron transport material, and a second layer contacting the cathode 16 comprised essentially of tris(8-hydroxyquinoline) aluminum ($Alq_3$). The thickness of the hole transport region was about 25 nanometers, the thickness of the mixed region was about 80 nanometers, the thickness of the first layer of the electron transport region was about 10 nanometers, the thickness of the second layer of the electron transport region was about 10 nanometers, and the hole transport region 13, the mixed region 14 and the electron transport region 15 were formed between an anode 12 comprised of indium-tin-oxide (ITO) having a thickness of about 200 nanometers, precoated on a glass substrate; and a cathode 16 comprised of a Mg:Ag (10:1 by weight) alloy having a thickness of about 120 nanometers. A thermal protective element comprised of silicon monoxide (SiO) and having a thickness of about 200 nanometers was coated on the cathode 16.

An eighth organic light emitting device (I-H) having a structure, such as the device 20 in FIG. 2, was formed and evaluated. The hole transport region 23 was comprised of N,N'-di(naphthalene-1-yl)-N,N'-diphenyl-benzidine (NPB) as the second hole transport material. The mixed region 24 was comprised of about 49.8 weight percent of N,N'-di (naphthalene-1-yl)-N,N'-diphenyl-benzidine (NPB) about 49.8 weight percent of (8-hydroxyquinoline) aluminum ($Alq_3$) used as the first hole transport material and the first electron transport material, respectively, and further comprised about 0.4 weight percent rubrene fluorescent material. The electron transport region 25 was comprised of two layers, a first layer contacting the mixed region comprised essentially of 1,4-bis(4-phenylquinolin-2-yl)benzene, 4,4'-bis(4-phenylquinolin-2-yl)-1,1'-biphenyl (TA), and used as the second electron transport material, and a second layer contacting the cathode 26 comprised of tris(8-hydroxyquinoline) aluminium ($Alq_3$). The thickness of the hole transport region was about 25 nanometers, the thickness of the mixed region was about 80 nanometers, the thickness of the first layer of the electron transport region was about 20 nanometers, the thickness of the second layer of the electron transport region was about 10 nanometers, and the hole transport region 23, the mixed region 24 and the electron transport region 25 were formed between an anode 22 comprised of indium-tin-oxide (ITO) having a thickness of about 200 nanometers, precoated on a glass substrate; and a cathode 26 comprised of an Mg:Ag (10:1 by weight) alloy having a thickness of about 120 nanometers. A thermal protective element comprised of silicon monoxide (SiO) and having a thickness of about for 200 nanometers was coated on the cathode 26.

The above generated organic light emitting devices were fabricated using a vacuum evaporation process at a pressure of about 6×10⁻⁶ torr. For each of the devices, the hole transport region was produced by evaporating the hole transport material at a rate of about 3 Å/s. The mixed region was evaporated by co-evaporation of the pure, about 99.9 percent by weight, hole transport material, the pure electron transport material, and the luminescent material, from separate sources, with the evaporation rate of the individual sources controlled at from about 0.1 Å/s to about 10 Å/s to obtain the desired mixing ratio. The electron transport region was produced by evaporating the electron transport material (s) at a rate of about 3 Å/s.

Following formation of the hole transport region, the mixed region and the electron transport region, an Mg:Ag metal cathode was deposited by co-evaporation of 100 percent pure Mg and pure Ag at a rate of 9 Å/s and 1 Å/s, respectively, to form a layer of about 120 nanometers thick. On the cathode, the thermal protective element comprised of a layer of SiO of about 200 nanometers thick was coated. All layers of the hole transport region, mixed region, electron transport region, cathode and the thermal protective element were deposited in the same vacuum pump down cycle without breaking the vacuum.

Table I-1 recites the materials used as the second hole transport material, the first hole transport material, the first electron transport material, the second electron transport material, and, if applicable, the additional luminescent material in the mixed region.

of about 22° C. and at an elevated temperature of about 70° C. in nitrogen gas under AC driving conditions at an average constant current density of 25 milliamperes per square centimeter, $mA/cm^2$, and represented in the form of the device half-life (the time elapsed before the device luminance decreases to half the initial luminance) from the initial luminance of each device. Since the device half-life is measured at extremely high levels of initial luminance, which is several times higher, brighter than a typical initial display luminance of 100 $cd/m^2$ under normal conditions, the measured half-life at 25 $mA/cm^2$ represents an accelerated half-life under high stressing conditions, which corresponds to a longer half-life under a typical initial display luminance of 100 $cd/m^2$. Table 1–2 shows the luminance at 25 $mA/cm^2$, color, electroluminescence efficiency, half-life at 25 $mA/cm^2$ and 22° C., projected half-life for operation at 22° C. from an initial luminance of 100 $cd/m^2$, half-life at 25 $mA/cm^2$ and 70° C. and projected half-life for operation at 70° C. from an initial luminance of 100 $cd/m^2$.

TABLE I-2

| Device | Luminance ($cd/m^2$) | Color | Efficiency (cd/A) | Half-life (in hours) at 25 $mA/cm^2$ at 22° C. | Half-life (in hours) from 100 $cd/m^2$ at 22° C. | Half-life (in hours) at 25 $mA/cm^2$ at 70° C. | Half-life (in hours) from 100 $cd/m^2$ at 70° C. |
|---|---|---|---|---|---|---|---|
| I-A | 605 | green | 2.42 | 5,000 | 30,250 | 800 | 4,840 |
| I-B | 840 | green | 3.36 | 4,000 | 33,600 | 650 | 5,460 |
| I-C | 800 | green | 3.20 | 4,000 | 32,000 | 650 | 5,200 |
| I-D | 1800 | yellow | 7.2 | 4,500 | 81,000 | 750 | 13,500 |
| I-E | 250 | red | 1.0 | 5,000 | 12,500 | 800 | 2,000 |
| I-F | 2500 | green | 10.0 | 4,500 | 112,500 | 750 | 18,750 |
| I-G | 1800 | yellow | 7.2 | 4,500 | 81,000 | 750 | 13,500 |
| I-H | 1800 | yellow | 7.2 | 4,500 | 81,000 | 750 | 13,500 |

TABLE I-1

| Device | Second Hole Transport Material | First Hole Transport Material | First Electron Transport Material | Second Electron Transport Material | Luminescent Material |
|---|---|---|---|---|---|
| I-A | CuPc | NPB | $AlQ_3$ | TA | — |
| I-B | NIC | NPB | $AlQ_3$ | TA | — |
| I-C | NIC | Biphenyl TPD | $AlQ_3$ | TA | — |
| I-D | NIC | NPB | $AlQ_3$ | TA | Rubrene |
| I-E | NIC | NPB | $AlQ_3$ | $AlQ_3$ | PtOEP |
| I-F | NIC | NPB | $AlQ_3$ | TA | C5454T |
| I-G | Biphenyl TPD | NPB | $AlQ_3$ | TA | Rubrene |
| I-H | NPB | NPB | $AlQ_3$ | TA | Rubrene |

Following fabrication, the luminance, color and electroluminescence efficiency of all the devices were measured using a Minolta model CS 100 Chroma Meter at a current density of about 25 $mA/cm^2$. The operational lifetimes were tested with the devices being operated at a room temperature The higher value indicates superior luminance, efficiency, and half-life.

Organic light emitting devices according to, for example, the Example embodiments above can be used in applications when a device half-life of several thousands of hours at an initial luminance of about 100 $cd/m^2$ even at elevated temperatures, such as, for example, temperatures ranging from about 70° C. to about 100° C. Furthermore, the organic light emitting devices according to this invention can be generated to produce different emission colors, such as, for example, red, yellow, green, or blue emission, by using different luminescent materials in the mixed region. In contrast, the half-life of an organic light emitting device of Van Slyke et al. referenced above are known to be limited to a few hundred hours or less, at an initial luminance of 100 $cd/m^2$, at high temperatures, for example, the prior art EL devices of J. R. Sheats et al, "Organic Electroluminescent Devices," *Science* 273, pp. 884–888, 1996, and also S. Tokito et al., "High-Temperature Operation of an Electroluminescent Device Fabricated Using a Novel Triphenylamine Derivative", *Appl. Phys. Lett.* 69, 878 (1996). In addition, the above Examples illustrate that the second hole transport material can be selected from a wide variety of materials, and therefore, can enable the use of economical materials in forming the hole transport region, thus limiting the use of more costly materials for the mixed region. For example, devices I-D, I-G and I-H, which use different hole transport materials in the mixed region, demonstrate essentially undistinguishable performance in terms of luminance, efficiency, color and stability.

EXAMPLE II

Organic Light Emitting Devices Wherein the First Electron Transport Material and the Second Electron Transport Material are not the Same Material A first organic light emitting device (referred to as II-A) having a structure, such as the device 20 in FIG. 2, was formed and evaluated. The hole transport region 23 was comprised of two layers, a first layer contacting the anode 22 comprised of copper phthalocyanine (CuPc), and a second layer contacting the mixed region 24 comprised essentially of N,N'-di(naphthalene-1-yl)-N,N'-diphenyl-benzidine (NPB) as the second hole transport material. The mixed region 24 was comprised of about 49.8 weight percent of N,N'-di(naphthalene-1-yl)-N,N'-diphenyl-benzidine (NPB) about 49.8 weight percent of (8-hydroxyquinoline) aluminum ($Alq_3$) used as the first hole transport material and the first electron transport material, respectively, and further the region contained about 0.4 weight percent of rubrene, a fluorescent material. The electron transport region 25 was comprised of two layers, a first layer contacting the mixed region, comprised of 1,4-bis(4-phenylquinolin-2-yl) benzene, 4,4'-bis(4-phenylquinolin-2-yl)-1,1'-biphenyl (TA), as the second electron transport material, and a second layer contacting the cathode 26 comprised essentially of tris(8-hydroxyquinoline) aluminum ($Alq_3$). The thickness of the first layer of the hole transport region was about 15 nanometers, the thickness of the second layer of the hole transport region was about 10 nanometers, the thickness of the mixed region was about 80 nanometers. The thickness of the first layer of the electron transport region was about 10 nanometers. The thickness of the second layer of the electron-transport region was about 10 nanometers, and the hole transport region 23, the mixed region 24 and the electron-transport region 25 were formed between an anode 22 comprised of indium-tin-oxide (ITO) having a thickness of about 200 nanometers, precoated on a glass substrate; and a cathode 26 comprised of a Mg:Ag (10:1 by weight) alloy having a thickness of about 120 nanometers. A thermal protective element comprised of silicon monoxide (SiO) and having a thickness of about 200 nanometers was coated on the cathode 26.

For comparison, a second organic light emitting device (II-B) having a structure identical to device II-A except that the electron transport region was comprised of a single layer comprised of $Alq_3$, the second electron transport material being of a thickness of about 20 nanometers was also formed. For this electroluminescent device the first hole transport material and the second hole transport material were the same (both comprise NPB), and also the first electron transport material and the second electron transport material were the same (both comprise $AlQ_3$).

The above organic light emitting device was fabricated using a vacuum evaporation process at a pressure of about $6 \times 10^{-6}$ torr. The hole transport region was produced by evaporating the hole transport material at a rate of about 3 A/s. The mixed region was evaporated by coevaporation of a pure hole transport material, a pure electron transport material, and when selected, the luminescent material, from separate sources, with the evaporation rate of the individual sources controlled at from about 0.1 A/s to about 10A/s to, for example, obtain the desired mixing ratio. The electron transport region was prepared by evaporating the electron transport material(s) at a rate of about 3 A/s.

Following formation of the hole transport region, the mixed region and the electron transport region, an Mg:Ag metal cathode was deposited by coevaporation of pure Mg and pure Ag at a rate of 9 A/s and 1 A/s, respectively, to form a layer of about 120 nanometers thick. On the cathode, the thermal protective element comprised essentially of a layer of SiO of about 200 nanometers thick was coated. All layers of the hole transport region, mixed region, electron transport region, cathode and the thermal protective element were deposited in the same vacuum pump down cycle without breaking the vacuum.

Following fabrication, the luminance, color and electroluminescence efficiency of the devices were measured at a current of density of about 25 $mA/cm^2$. The operational lifetime was tested with the devices being operated at a room temperature of about 22° C. and at an elevated temperature of about 90° C. in nitrogen gas under AC driving conditions at an average constant current density of 25 $mA/cm^2$, and represented in the form of the device half-life (the time elapsed before the device luminance decreases to half the initial luminance) from the initial luminance of each device. Since the device half-life is measured at extremely high levels of initial luminance, which is several times higher, brighter than a typical initial display luminance of 100 $cd/m^2$ under normal conditions, the measured half-life at 25 $mA/cm^2$ represents an accelerated half-life under high stressing conditions, which corresponds to a longer half-life under a typical initial display luminance of 100 $cd/m^2$. Table II-1 shows the luminance at 25 $mA/cm^2$, color, electroluminescence efficiency, half-life at 25 $mA/cm^2$ and 22° C., projected half-life for operation at 22° C. from an initial luminance of 100 $cd/m^2$, half-life at 25 $mA/cm^2$ and 90° C., and projected half-life for operation at 90° C. from an initial luminance of 100 $cd/m^2$.

TABLE II-1

| Device | Luminance ($cd/m^2$) | Color | Efficiency (cd/A) | Half-life (in hours) at 25 $mA/cm^2$ at 22° C. | Half-life (in hours) from 100 $cd/m^2$ at 22° C. | Half-life (in hours) at 25 $mA/cm^2$ at 90° C. | Half-life (in hours) from 100 $cd/m^2$ at 90° C. |
| --- | --- | --- | --- | --- | --- | --- | --- |
| II-A | 1960 | yellow | 7.84 | 4,500 | 88,200 | 550 | 10,780 |
| II-B | 1600 | yellow | 6.40 | 4,500 | 72,000 | 550 | 8,800 |

This Example demonstrates that organic light emitting device according to embodiments of the present invention (device II-A) demonstrates higher luminance and increased electroluminescence efficiency compared to device II-B (each of the two properties is about 22.5 percent higher in device II-A than in device II-B). The higher luminance and electroluminescence efficiency would that lower currents (and hence reduced power consumption) needed to obtain a certain brightness. The higher brightness and efficiency also translate to a longer device half-life from an initial luminance of 100 cd/m², resulting from the increased efficiency allowing the use of lower currents to obtain an initial luminance of 100 cd/m², and since device degradation was accelerated by increased driving currents.

EXAMPLE III

In this Example, the first hole transport material and the second hole transport material are not the same material, and wherein the electroluminescent (EL) device resulting possesses a higher driving voltage stability at elevated temperatures compared to other organic light emitting devices, wherein the first hole transport material and the second hole transport material are the same.

A first organic light emitting device (device III-A) having a structure, such as the device 30 in FIG. 3, was formed and evaluated. The hole transport region 33 was comprised of copper phthalocyanine (CuPc), as the second hole transport material. The mixed region 34 was comprised essentially of about 49.8 weight percent of N,N'-di(naphthalene-1-yl)-N,N'-diphenyl-benzidine (NPB), about 49.8 weight percent of (8-hydroxyquinoline) aluminium ($Alq_3$) used as the first hole transport material and the first electron transport material, respectively, and further comprised about 0.4 weight percent of rubrene fluorescent material. The electron transport region 35 was comprised of tris(8-hydroxyquinoline) aluminum ($Alq_3$), and used as the second electron transport material. The thickness of the hole transport region was about 25 nanometers, the thickness of the mixed region was about 80 nanometers, the thickness of the electron transport region was about 20 nanometers, and the hole transport region 33, the mixed region 34 and the electron transport region 35 were formed between the anode 32 comprised of indium-tin-oxide (ITO) having a thickness of about 200 nanometers, precoated on a glass substrate; and a cathode 36 comprised of an Mg:Ag (10:1 by weight) alloy having a thickness of about 120 nanometers. A thermal protective element comprised of silicon monoxide (SiO) and having a thickness of about 200 nanometers was coated on the cathode 36.

For comparison, a second organic light emitting device (III-B) having a structure identical to device III-A except that the hole transport region was comprised of N,N'-di(naphthalene-1-yl)-N,N'-diphenyl-benzidine (NPB), as the second hole transport material of a thickness about 25 nanometers. In this second device, the first hole transport material and the second hole transport material were comprised of the same material or compound (NPB), and the first electron transport material and the second electron transport material were both comprised of $AlQ_3$.

The organic light emitting devices were fabricated using a vacuum evaporation process at a pressure of about $6 \times 10^{-6}$ torr. The hole transport region was produced by evaporating the hole transport material at a rate of about 3 Å/s. The mixed region was evaporated by coevaporation of pure hole transport material, pure electron transport material, and when present the luminescent material from separate sources with the evaporation rate of the individual sources controlled at from about 0.1 Å/s to about 10 Å/s to obtain the desired mixing ratio. The electron transport region was produced by evaporating the electron transport material(s) at a rate of about 3 Å/s.

Following formation of the hole transport region, the mixed region and the electron transport region, an Mg:Ag metal cathode was deposited by coevaporation of pure Mg and pure Ag at a rate of 9 Å/s and 1 Å/s, respectively, to form a layer of about 120 nanometers thick. On the cathode, the thermal protective element comprised of a layer of SiO of about 200 nanometers thick was coated. All layers of the hole transport region, mixed region, electron transport region, cathode and the thermal protective element were deposited in the same vacuum pump down cycle without breaking the vacuum.

Changes (increase) in driving voltage of the first and second organic light emitting devices were tested under identical conditions with the devices operated at a temperature of 90° C. in nitrogen gas under AC driving conditions at an average constant current density of 31.25 mA/cm². At this current density, the initial luminance of the first device (device III-A) and second device (III-B) was about 1,600 cd/m² and 1,850 cd/m², respectively, and the initial driving voltages of the two devices was 9 and 7.8 volts, respectively. Table III-1 shows the increase of driving voltage of the two devices as a percentage of the initial driving voltage of each device after continuous operation for the recited periods of time at this temperature and current density of 0.1 percent or undetectable.

TABLE III-1

| Time Elapsed | Percent Increase In Driving Voltage Of Device III-A | Percent Increase In Driving Voltage Of Device III-B |
| --- | --- | --- |
| 50 hours | Less than 1 percent | 6 percent |
| 100 hours | Less than 1 percent | 17 percent |
| 150 hours | 1 percent | 35 percent |
| 200 hours | 3 percent | 48 percent |
| 250 hours | 5 percent | 60 percent |

From the results in the Table III-1, there is illustrated that the device according to this invention (device III-A) demonstrates a much higher driving voltage stability in the form of a much smaller voltage increase, even after operating for 250 hours at 90° C. at a current density of 31.25 mA/cm², compared to the organic light emitting device (device III-B). Therefore, devices according to embodiments of the present invention are more suitable for applications which may require operating the organic light emitting devices at elevated temperatures over an extended period of time, and particularly when a higher stability of driving voltage is desired.

Organic light emitting devices according to this invention can be used in various normal temperature condition technological applications. Furthermore, the high-temperature operational stability of the organic light emitting devices enables them to be used at high temperatures and in harsh conditions, and for industrial operations. For example, the devices can be used in various types of displays such as, for example, in automobiles and other types of vehicles, computer monitors, televisions and the like, such as electronic devices and systems. The devices in embodiments provide stable performance at high temperatures of at least, for example, about 50° C. or about 70° C. or even higher, for example, about 100° C. for extended lifetimes, such as at least about 1,000 hours. Thus, the organic light emitting devices according to embodiments of this invention can be used in applications in which conventional bilayer devices may not be as suitable. In addition, the organic light emitting devices according to this invention feature an increased brightness and efficiency, more stable driving voltage at elevated temperatures, and greater latitude in selecting materials, and hence potentially more economical organic light emitting devices.

Other embodiments and modifications of the present invention may occur to those skilled in the art subsequent to a review of the information presented herein; these embodiments and modifications thereof, inclusive of equivalents thereof, substantial equivalents thereof, or similar equivalents thereof are also included within the scope of this invention.

What is claimed is:

1. An organic light emitting device comprising
   (i) a first electrode;
   (ii) a mixed region comprising a first hole transport material and a first electron transport material;
   (iii) a second electrode;
   (iv) a thermal protective layer coated on one of said first and second electrodes, wherein one of said first and second electrodes is a hole injection anode, and one of said electrodes is an electron injection cathode, and wherein the organic light emitting device further comprises at least one of
   (v) a hole transport region interposed between said anode and said mixed region; and wherein said hole transport region is comprised of a second hole transport material, and which material is in contact with the mixed region; and
   (vi) an electron transport region interposed between said cathode and said mixed region, and wherein said region is comprised of a second electron material, and which material is in contact with the mixed region; and containing at least one of
   a. said hole transport region (v) wherein said first hole transport material (ii) is similar to or dissimilar than said second hole transport material (v);
   b. said electron transport region (vi) wherein said first electron transport material (ii) is similar to or dissimilar than said second electron transport material; and wherein when a. is similar, b. is dissimilar when a. is dissimilar, b. is similar or dissimilar; and when b. is dissimilar, a. is similar or dissimilar.

2. An organic light emitting device in accordance with claim 1 wherein said electron transport region is interposed or situated between said cathode and the mixed region, said hole transport region is interposed between said anode and the mixed region, and wherein said first electron transport material and said second electron transport material are dissimilar, and wherein said first hole transport material and said second hole transport material are dissimilar.

3. An organic light emitting device in accordance with claim 1 wherein said electron transport region is interposed between said cathode and said mixed region, and said hole transport region is interposed between said anode and the mixed region, and wherein said first electron transport material and said second electron transport material are dissimilar, and wherein said first hole transport and said second hole transport material are comprised of the same components.

4. An organic light emitting device in accordance with claim 1 wherein said electron transport region is situated between said cathode and the mixed region, wherein said hole transport region is interposed between said anode and the mixed region, and wherein said first electron transport material and said second electron transport material are similar, and wherein said first hole transport material and said second hole transport material are dissimilar.

5. An organic light emitting device in accordance with claim 1 wherein said electron transport region is interposed between said cathode and said mixed region, wherein said organic light emitting device is free of said hole transport region, and wherein said first electron transport material and said second electron transport material are dissimilar.

6. An organic light emitting device in accordance with claim 1 wherein said hole transport region is interposed between said anode and said mixed region, wherein said organic light emitting is free of an electron transport region, and wherein said first hole transport material and said second hole transport material are dissimilar.

7. An organic light emitting device in accordance with claim 1 wherein at least one of a. or b. is present, and wherein said first hole transport material or said second hole transport is a component selected from the group consisting of tertiary aromatic amines, bicarbazoles, and indolocarbazoles; and wherein said first electron transport is selected from the group consisting of metal oxinoids, stilbenes, triazines, and quinolines.

8. An organic light emitting device in accordance with claim 7 wherein said tertiary aromatic amine is selected from the group consisting of N,N'-di(naphthalene-1-yl)-N, N'-diphenyl-benzidine (NPB) and N,N'-bis(p-biphenyl)-N, N'-diphenyl benzidine (biphenyl TPD); wherein said indolocarbazole is selected from the group consisting of 5,11-di-naphthyl-5,11-dihydroindolo[3,2-b]carbazole and 2,8-dimethyl-5,11-di-naphthyl-5,11-dihydroindolo[3,2-b]carbazole; and wherein said metal oxinoid is selected from the group consisting of tris(8-hydroxyquinoline) aluminum ($Alq_3$) and bis(8-hydroxyquinolato)-(4-phenylphenolato) aluminum (Balq).

9. An organic light emitting device in accordance with claim 1 wherein said hole transport region comprises a porphyrin.

10. An organic light emitting device in accordance with claim 9 wherein said porphyrin is a metal phthalocyanine.

11. An organic light emitting device in accordance with claim 10 wherein said metal phthalocyanine is copper phthalocyanine (CuPc).

12. An organic light emitting device in accordance with claim 1 wherein said hole transport region comprises at least two layers.

13. An organic light emitting device in accordance with claim 1 wherein said hole transport region comprises (i) a first layer contacting the anode wherein the first layer comprises a porphyrin, and (ii) a second layer contacting the mixed region wherein the second layer comprises said second hole transport material.

14. An organic light emitting device in accordance with claim 1 wherein said hole transport region is comprised of a layer comprising a mixture of (i) from about 25 weight percent to about 99 weight percent of a porphyrin; and (ii) from about 75 weight percent to about 1 weight percent of said second hole transport material.

15. An organic light emitting device in accordance with claim 1 wherein said electron transport region comprises at least two layers.

16. An organic light emitting device in accordance with claim 15 wherein said electron transport region comprises (i) a first layer contacting the cathode, and (ii) a second layer contacting said mixed region wherein said second layer comprises said second electron transport material.

17. An organic light emitting device in accordance with claim 1 wherein there is at least one of (1) an anode comprising a layer comprised of indium-tin-oxide, and (2) a cathode comprising a layer selected from the group consisting of (a) a layer comprised of Mg and Ag; (b) a layer comprised of Al; (c) a layer comprised of indium-tin-oxide: (d) a layer comprised of an organic compound Mg and Ag; and (e) mixtures thereof.

18. An organic light emitting device in accordance with claim 17 wherein said cathode further comprises an alkaline metal or a compound thereof.

19. An organic light emitting device in accordance with claim 18 wherein said alkaline metal is selected tram the group consisting of Li, Na, K and Cs.

20. An organic light emitting device in accordance with claim 1 wherein said thermal protective layer comprises a layer of SiO, $SiO_2$ or mixtures thereof.

21. An organic light emitting device in accordance with claim 1 wherein the mixed region (ii) contains a luminescent material optionally selected from the group consisting of fluorescent materials of coumarin, dicyanomethylene pyranes, polymethine, oxabenzanthrane, xanthene, pyrylium, carbostyl, perylene, acridone, quinacridone, rubrene, anthracene, coronene, phenanthracene, pyrene, butadiene, stilbene, lanthanide metal chelate complexes, and rare-earth metal chelate complexes.

22. An organic light emitting device in accordance with claim 21 wherein said luminescent material is selected from the group consisting of rubrene, N,N'-dimethylquinacridone (DMQ), 10-2-(benzothiazolyl)-2,3,6,7-tetrahydro-1,1,7,7-tetramethyl-1H, 5H, 11H-(1)benzopyropyrano (6,7,-8-ij) quinollzin-11-one(C545T), and (2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4-ylidene)propanedinitrile (DCJTB).

23. An organic light emitting device in accordance with claim 1 wherein the mixed region (ii) contains a luminescent material, and which luminescent material is a phosphorescent material.

24. An organic light emitting device in accordance with claim 23 wherein said luminescent material is selected from the group consisting of 2,3,7,8,12,13,17,18-octaethyl-21H, 23H-phorpine platinum(II) (PtOEP) and fac tris(2-phenylpyridine)iridium ($Ir(ppy)_3$).

25. An organic light emitting device in accordance with claim 1 wherein said mixed region comprises from about 10 weight percent to about 90 weight percent of said first hole transport material, and from about 90 weight percent to about 10 weight percent of said first electron transport material, and wherein the total thereof is about 100 percent.

26. An organic light emitting device in accordance with claim 25 wherein said mixed region further comprises from about 0.01 weight percent to about 50 weight percent of a luminescent material.

27. An organic light emitting device in accordance with claim 1 wherein said mixed region comprises from about 25 weight percent to about 75 weight percent of said first hole transport material, and from about 75 weight percent to about 25 weight percent of said first electron transport material.

28. An organic light emitting device in accordance with claim 27 wherein said mixed region further comprises from about 0.01 weight percent to about 50 weight percent of a luminescent material.

29. An organic light emitting device in accordance with claim 27 wherein said first hole transport material is selected from the group consisting of N,N'-di(naphthalene-1-yl)-N,N'-diphenyl-benzidine (NPB) and N,N'-bis(p-biphenyl)-N,N'-diphenyl benzidine (biphenyl TPD); and wherein said first electron transport material is selected from the group consisting of tris(8-hydroxyquinoline) aluminum ($Alq_3$) and bis(8-hydroxyquinolato)-(4-phenylphenolato)aluminum (Balq).

30. An organic light emitting device in accordance with claim 1 wherein the thickness of the organic light emitting device is from about 100 nanometers to about 5,000 nanometers, and wherein the thickness of said mixed region is from about 10 nanometers to about 500 nanometers, and optionally wherein said thermal protective layer is present on said anode and said cathode.

31. An organic light emitting device in accordance with claim 1 wherein the thickness of said mixed region is from about 20 nanometers to about 200 nanometers.

32. An organic light emitting device in accordance with claim 1 and comprising in sequence an anode;

a mixed region comprised of from about 35 weight percent to about 65 weight percent of a first hole transport material selected from the group consisting of N,N'-di(naphthalene-1-yl)-N,N'-diphenyl-benzidine (NPB) and N,N'-bis(p-biphenyl)-N,N'-diphenyl benzidine (biphenyl TPD), and from about 65 weight percent to about 35 weight percent of a first electron transport material selected from the group consisting of tris(8-hydroxyquinoline)aluminum ($AlQ_3$) and bis(8-hydroxyquinolato)-(4-phenylphenolato)aluminum (Balq); wherein all weight percentages are based on the total weight of materials comprising the mixed region, and wherein the thickness of the mixed region is from about 20 nanometers to about 200 nanometers;

a cathode;

a hole transport region situated between said anode and said mixed region comprised of (a) a layer with a thickness of from about 5 nanometers to about 100 nanometers of a second hole transport material selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole; (b) a layer with thickness of from about 5 nanometers to about 100 nanometers comprised of from about 50 weight percent to about 99 weight percent of copper phthalocyanine (CuPc) and from about 50 weight percent to about 1 weight percent of a second hole transport material selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole, or (c) two layers, a first layer contacting the anode with a thickness of from about 10 nanometers to about 50 nanometers comprised of copper phthalocyanine (CuPc), and a second layer coated on the first layer with a thickness of from about 5 nanometers to about 50 nanometers and comprised of a second hole transport material selected from the group consisting of N,N'-di(naphthalene-1-yl)-N,N'-diphenyl-benzidine (NPB), N N'-bis(p-biphenyl)-N,N-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b]carbazole, and wherein the second layer contacts the mixed region;

an electron transport region situated between the cathode and the mixed region, and comprised of one of (a) a layer with thickness of from about 5 nanometers to about 50 nanometers comprised of a second electron transport material selected from the group consisting of tris(8-hydroxyquinoline)aluminum ($Alq_3$) and bis(8-hydroxyquinolato)-(4-phenylphenolato)aluminum (Balq), or (b) two layers, a first layer contacting the mixed region with a thickness of from about 5 nanometers to about 25 nanometers comprised of a second electron transport material selected from the group consisting of tris(8-hydroxyquinoline)aluminum (Alqa), bis(8-hydroxyquinolato)-(4-phenylphenolato) aluminum (Balq) and 1,4-bis(4-phenylquinolin-2-yl) benzene, 4,4'-bis(4-phenylquinolin-2-yl)-1,1'-biphenyl (TA), and a second layer with a thickness of from about 5 nanometers to about 25 nanometers comprised of a material selected from the group consisting of (8-hydroxyquinoline)aluminum ($Alq_3$), copper phthalocyanine (CuPC), 4,4'-bis-[2-(4,6-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazinyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl and 2,4,6-tris(4-biphenylyl)-1,3,5-triazine.

33. An organic light emitting device in accordance with claim 32 wherein the mixed region further comprises one of from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7,-8-ij)quinolizin-11-one (C545T);

from about 0.2 weight percent to about 5 weight percent of (2-(1,1-dimethylethyl)-6-(2-(2,3,6,7-tetrahydro-1,1,7,7-tetramethyl-1H,5H-benzo(ij)quinolizin-9-yl) ethenyl)-4H-pyran-4-ylidene)propanedinitrile (DCJTB); or from about 5 weight percent to about 15 weight percent of 2,3,7,8,12,13,17,18-octaethyl-21H,23H-phorpine platinum(II) (PtOEP) wherein all weight percentages are based on the total weight of materials comprising the mixed region.

34. An organic light emitting device in accordance with claim 1 and comprising in sequence (i) an anode of indium-tin-oxide with a thickness of from about 30 to about 300 nanometers coated on a substrate, the anode and the substrate being capable of transmitting at least about 70 percent of radiation of wavelength of from about 400 nanometers to about 750 nanometers;

(ii) a mixed region comprised of from about 35 weight percent to about 65 weight percent of a first hole transport material selected from the group consisting of N,N'-di(naphthalene-1-yl)-N,N'-diphenyl-benzidine (NPB) and N,N'-bis(p-biphenyl)-N,N'-diphenyl benzidine (biphenyl TPD) and from about 65 weight percent to about 35 weight percent of a first electron transport material selected from the group consisting of tris(8-hydroxyquinoline)aluminum ($AlQ_3$) and bis(8-hydroxyquinolato)-(4-phenylphenolato)aluminum (Balq) wherein all weight percentages are based on the total weight of materials comprising the mixed region, and wherein the thickness of the mixed region is from about 20 nanometers to about 200 nanometers;

(iii) a cathode comprised of one of (a) a layer comprised of Mg:Ag alloy or Al of a thickness of from about 50 nanometers to about 500 nanometers, or (b) two layers, a first layer comprised of from about 40 volume percent to about 55 volume percent of Mg; from about 2 volume percent to about 10 volume percent of Ag and from about 55 volume percent to about 40 volume percent of an organic compound, wherein the thickness of the first layer is from about 100 nanometers to about 600 nanometers; and coated with a second layer of a thickness of from about 50 nanometers to about 500 nanometers and comprising a metal or a metal alloy;

(iv) a thermal protective layer situated on the cathode comprised of SiO, $SiO_2$ or mixtures thereof of a thickness of from about 100 nanometers to about 1,000 nanometers;

(v) a hole transport region situated between the anode and the mixed region comprised of (a) a layer with a thickness of from about 5 nanometers to about 100 nanometers of a second hole transport material selected from the group consisting of copper phthalocyanine (CuPc), N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b] carbazole; (b) a layer with a thickness of from about 5 nanometers to about 100 nanometers comprised of from about 50 weight percent to about 99 weight percent of copper phthalocyanine (CuPc) and from about 50 weight percent to about 1 weight percent of a second hole transport material selected from the group consisting of N,N'-di(naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo[3,2-b]carbazole (NIC), and 2,8-dimethyl-5,11-di-naphthyl-5,11-dihydroindolo[3,2-b] carbazole, or (c) two layers, a first layer contacting the anode, wherein said first layer possesses a thickness of from about 10 nanometers to about 50 nanometers and is comprised of copper phthalocyanine (CuPc), and said second layer in contact with the first layer, said second layer possessing a thickness of from about 5 nanometers to about 50 nanometers and which is comprised of a second hole transport material of N,N'-di (naphthalene-1-yl)-N,N'-diphenyl-benzidine (NPB), N,N'-bis(p-biphenyl)-N,N'-diphenyl benzidine (biphenyl TPD), 5,11-di-naphthyl-5,11-dihydroindolo [3,2-b]carbazole (NIC), and 2,8-dimethyl-5,11-di-naphthyl-5,11-dihydroindolo[3,2-b]carbazole in the second layer contacting the mixed region;

(vi) an electron transport region situated between the cathode and the mixed region comprised of (a) a layer with thickness of from about 5 nanometers to about 50 nanometers of a second electron transport material selected from the group consisting of tris(8-hydroxyquinoline)aluminum (Alqs) and bis(8-hydroxyquinolato)-(4-phenylphenolato)aluminum (Balq), or (b) two layers, a first layer contacting the mixed region with a thickness of from about 5 nanometers to about 25 nanometers, comprised of a second electron transport material selected from the group consisting of tris(8-hydroxyquinoline) aluminum ($Alq_3$), bis(8-hydroxyquinolato)-(4-phenylphenolato) aluminum (Balq) and 1,4-bis(4-phenylquinolin-2-yl) benzene, 4,4'-bis(4-phenylquinolin-2-yl)-1,1'-biphenyl (TA), and a second layer with thickness of from about 5 nanometers to about 25 nanometers comprised of a material selected from the group consisting of (8-hydroxyquinoline)aluminum ($Alq_3$), copper phthalocyanine (CuPc), 4,4'-bis-[2-(4,8-diphenyl-1,3,5-triazinyl)]-1,1'-biphenyl, 4,4'-bis-[2-(4,6-di-p-tolyl-1,3,5-triazinyl)]-1,1'-biphenyl, 4,4'-bis-[2-(4,6-di-m-tolyl-1,3,5-triazlnyl)]-1,1'-biphenyl, 4,4'-bis-[2-(4,6-di-p-methoxyphenyl-1,3,5-triazinyl)]-1,1'-biphenyl, 4,4'-bis-[2-(4,6-di-m-methoxyphenyl-1,3,5-triazinyl)]-1,1'-biphenyl and 2,4,6-tris(4-biphenylyl)-1,3,5-triazine.

35. An organic light emitting device in accordance with claim 34 wherein the mixed region comprises at least one of
  (i) from about 0.2 weight percent to about 2 weight percent of a luminescent material selected from the group consisting of rubrene, N,N'-dimethylquinacridone (DMQ), and 10-2-(benzothiazolyl)-2,3,6,7-tetrahydro-1,1,7,7-tetramethyl-1H, 5H, 11H-(1)benzopyropyrano (6,7, -8-ij) quinollzin-11-one (C845T);
  (ii) from about 0.2 weight percent to about 5 weight percent of (2-(1,1-dimethylethyl)-6-(2-(2,3,6,7-tetrahydro-1,1,7,7-tetramethyl-1H,5H-benzo(ij) quinolizin-9-yl)ethenyl)-4H-pyran-4-ylidene) propanedinitrile (DCJTB); or
  (iii) from about 5 weight percent to about 15 weight percent of 2,3,7,8,12,13,17,18-octaethyl-21H,23H-phorpine platinum(II) (PtOEP) wherein all weight percents are based on the total weight of materials comprising the mixed region.

36. A display comprising at least one organic light emitting device in accordance with claim 1.

37. A method of forming an organic light emitting device of claim 1 wherein the method comprises a vacuum evaporation process or spin coating.

38. A method in accordance with claim 37 wherein the vacuum evaporation process is accomplished at a vacuum of from about $5\times10^{-12}$ to about $5\times10^{-3}$ millimeters Hg.

39. An organic light emitting device in accordance with claim 1 wherein each of said regions (ii), (v) and (vi) are comprised of from about 1 layer to about 5 layers.

40. An organic light emitting device in accordance with claim 1 wherein each of said regions (ii), (v) and (vi) are comprised of a plurality of layers.

41. An organic light emitting device in accordance with claim 1 wherein said first hole transport material and said second hole transport material are dissimilar.

42. An organic light emitting device in accordance with claim 1 wherein said first hole transport material and said second hole transport material are similar.

43. An organic light emitting device in accordance with claim 1 wherein each of said regions (ii), (v) and (vi) are comprised of one layer.

44. An organic light emitting device in accordance with claim 1 wherein said hole transport region (v) is comprised of from 1 to about 5 layers, and wherein said layer in contact with said mixed region (ii) is comprised of a dissimilar hole transport material than said first hole transport material (ii).

45. An organic light emitting device in accordance with claim 1 wherein one of said first hole transport (ii) and electron transport (ii) also functions as a luminescent material.

46. An organic light emitting device in accordance with claim 1 further containing in (ii) a luminescent material.

47. An organic light emitting device in accordance with claim 1 wherein said electron transport region (v) is comprised of from 1 to about 5 layers, and wherein said layer in contact with said mixed region (ii) is comprised of a dissimilar electron transport material than said first electron transport material (ii).

48. An organic light emitting device in accordance with claim 1 wherein said protective layer is present thereby optionally enabling device operation at high temperatures, which temperatures are optionally from about 70° C. to about 100° C.

49. An organic light emitting device in accordance with claim 1 wherein said device functions at a temperature of from about 22° C. to about 70° C.

50. An organic light emitting device in accordance with claim 1 wherein a. is similar and b. is dissimilar.

51. An organic light emitting device in accordance with claim 1 wherein a. is dissimilar and b. is similar or dissimilar.

52. n organic light emitting device in accordance with claim 1 wherein the thermal protective layer is a silicon oxide or a silicon dioxide.

53. A device comprised of
  (i) a first electrode:
  (ii) a mixed region comprising a first hole transport material and a first electron transport material;
  (iii) a second electrode;
  (iv) a thermal protective layer coated on one of the first and second electrodes, or both electrodes, wherein one of the said first and second electrodes is a hole injection anode, and one of said electrodes is an electron injection cathode, and wherein the organic light emitting device further comprises at least one of
  (v) a hole transport region interposed between said anode and said mixed region; and wherein said hole transport region is comprised of a second hole transport material, and which material is in contact with the mixed region; and
  (vi) an electron transport region interposed between said cathode and said mixed region, and wherein said region is comprised of a second electron material, and which material is in contact with the mixed region; and containing at least one of
    a. said hole transport region (v) wherein said first hole transport material (ii) is similar to or dissimilar than said second hole transport material (v);
    b. said electron transport region (vi) wherein said first electron transport material (ii) is similar to or dissimilar than said second electron transport material; and wherein when a. is similar, b. is dissimilar; when a. is dissimilar, b. is similar or dissimilar; when b. is dissimilar, a. is similar or dissimilar.

54. An organic light emitting device consisting essentially of
  (i) a first electrode;
  (ii) a mixed region comprising a first hole transport material and a first electron transport material;
  (iii) a second electrode;
  (iv) a thermal protective layer coated on one of said first and second electrodes, wherein one of said first and second electrodes is a hole injection anode, and one of said electrodes is an electron injection cathode, and wherein the organic light emitting device further comprises at least one of
    (v) a hole transport region interposed between said anode and said mixed region; and wherein said hole transport region is comprised of a second hole transport material, and which material is in contact with the mixed region; and
    (vi) an electron transport region interposed between said cathode and said mixed region, and wherein said region is comprised of a second transporting electron material, and which material is in contact with the mixed region; and wherein said hole transport region (v) contains a first hole transport material (ii) that is similar to or dissimilar than second hole transport material (v).

55. A device in accordance with claim 54 wherein said electron transport region (vi) contains said second electron transporting material that is either similar to or dissimilar to the said first electron transporting material.

* * * * *